US012699327B2

(12) United States Patent
Komori

(10) Patent No.: US 12,699,327 B2
(45) Date of Patent: Aug. 4, 2026

(54) SUBSTRATE PROCESSING APPARATUS

(71) Applicant: SCREEN HOLDINGS CO., LTD., Kyoto (JP)

(72) Inventor: Jun Komori, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 376 days.

(21) Appl. No.: 18/456,264

(22) Filed: Aug. 25, 2023

(65) Prior Publication Data

US 2024/0077807 A1    Mar. 7, 2024

(30) Foreign Application Priority Data

Sep. 2, 2022    (JP) ................................. 2022-140341

(51) Int. Cl.
*G03F 7/00*          (2006.01)

(52) U.S. Cl.
CPC ...... *G03F 7/70808* (2013.01); *G03F 7/70058* (2013.01)

(58) Field of Classification Search
CPC .......................... G03F 7/70808; G03F 7/70058
See application file for complete search history.

(56) References Cited

U.S. PATENT DOCUMENTS

2010/0151690 A1*  6/2010  Britcher .............. H10P 72/0462
                                                      438/758
2015/0314338 A1   11/2015  Morioka et al.

FOREIGN PATENT DOCUMENTS

| JP | 10-004050 A | 1/1998 |
|---|---|---|
| JP | 2005-349265 A | 12/2005 |
| JP | 2007-307545 A | 11/2007 |
| JP | 2007-329426 A | 12/2007 |
| JP | 2012-510732 A | 5/2012 |
| JP | 2018-163898 A | 10/2018 |
| KR | 10-2006-0033316 A | 4/2006 |
| WO | WO 2014/103523 A1 | 7/2014 |

OTHER PUBLICATIONS

Extended European Search Report, dated Feb. 2, 2024, issued in corresponding European Patent Application No. 23194267.3.

* cited by examiner

*Primary Examiner* — Nicole M Ippolito

(74) *Attorney, Agent, or Firm* — OSTROLENK FABER LLP

(57) ABSTRACT

A substrate processing apparatus includes a cup, an exhaust duct, a mist collecting member and a lid portion. The cup surrounds a substrate being processed with use of a processing liquid. The exhaust duct has an opening in a portion not overlapping with the cup in a plan view and forms an exhaust flow path for exhausting a gas in the cup. The mist collecting member is provided at a position overlapping with the opening and collects mist of the processing liquid in the exhaust duct. The lid portion closes the opening of the exhaust duct.

11 Claims, 19 Drawing Sheets

F I G.  3
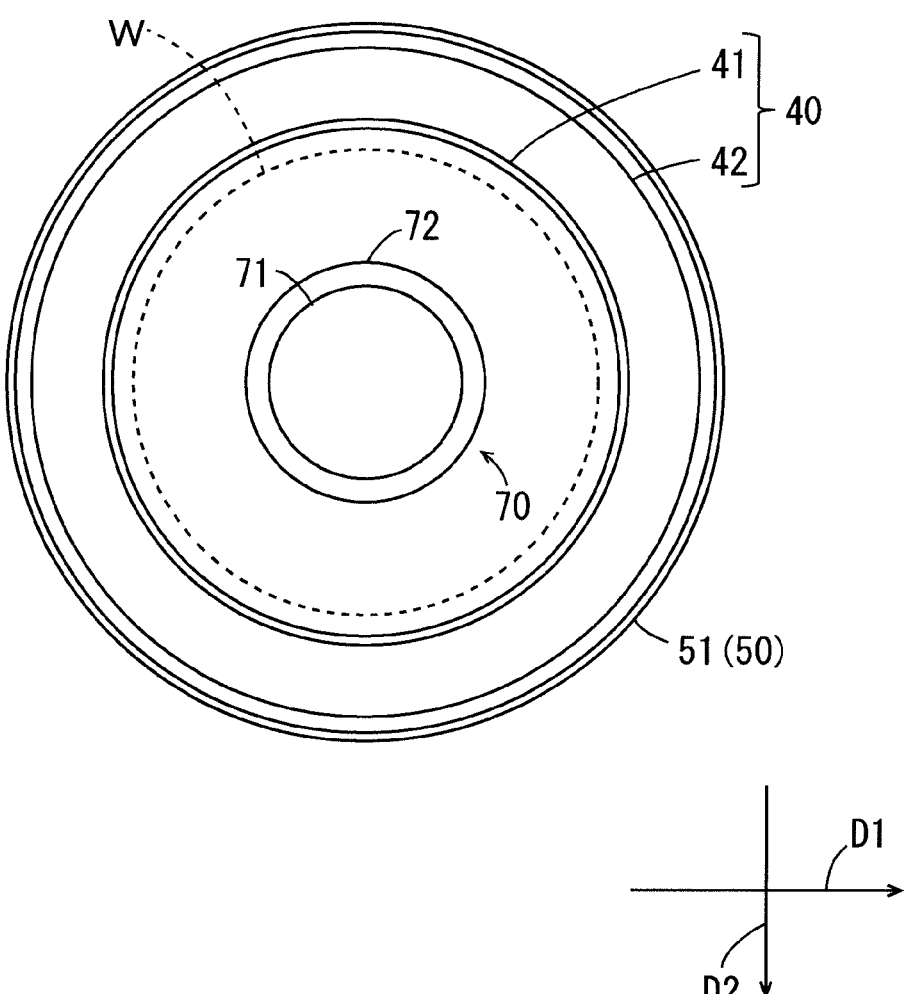

F I G. 4
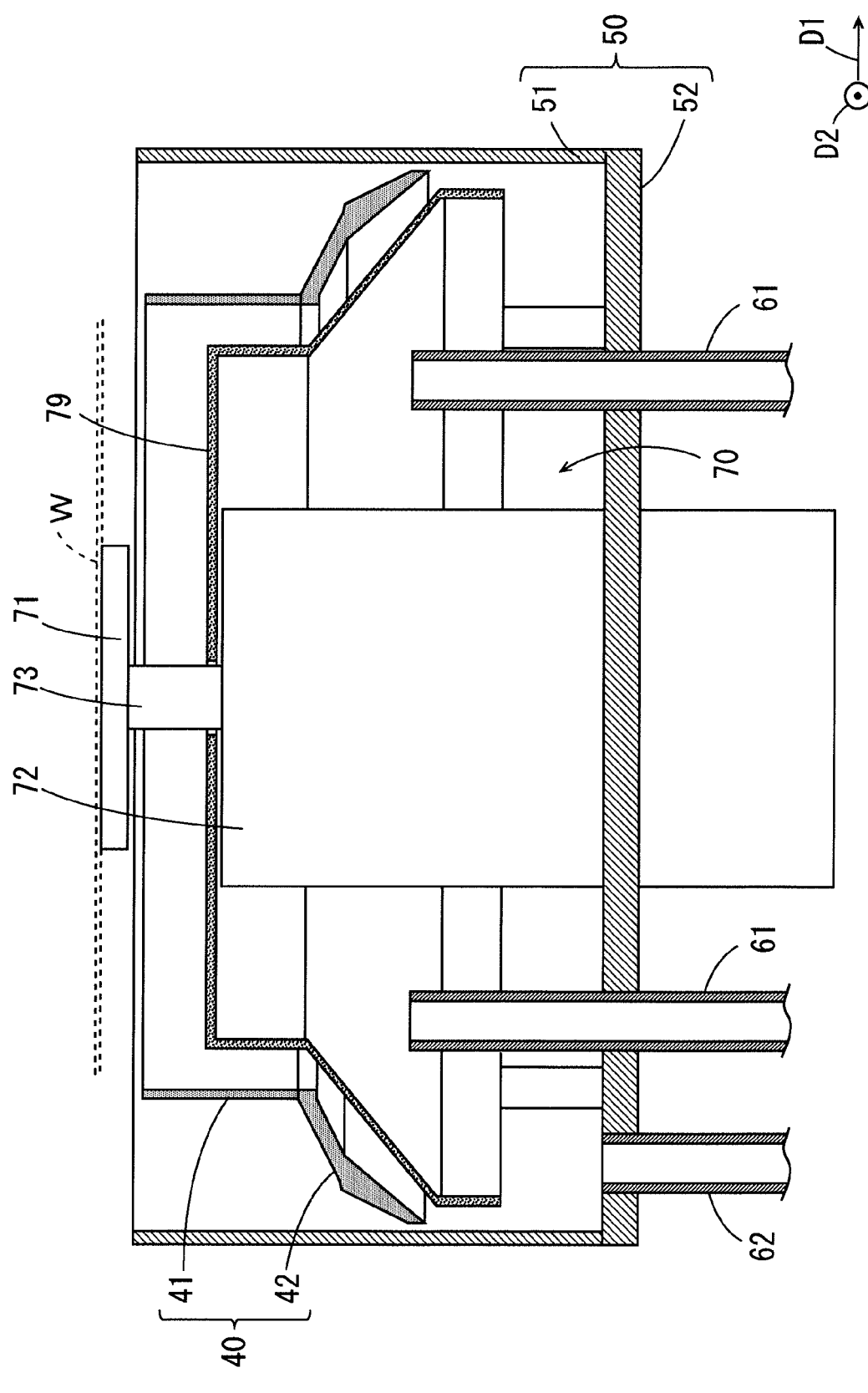

F I G. 5
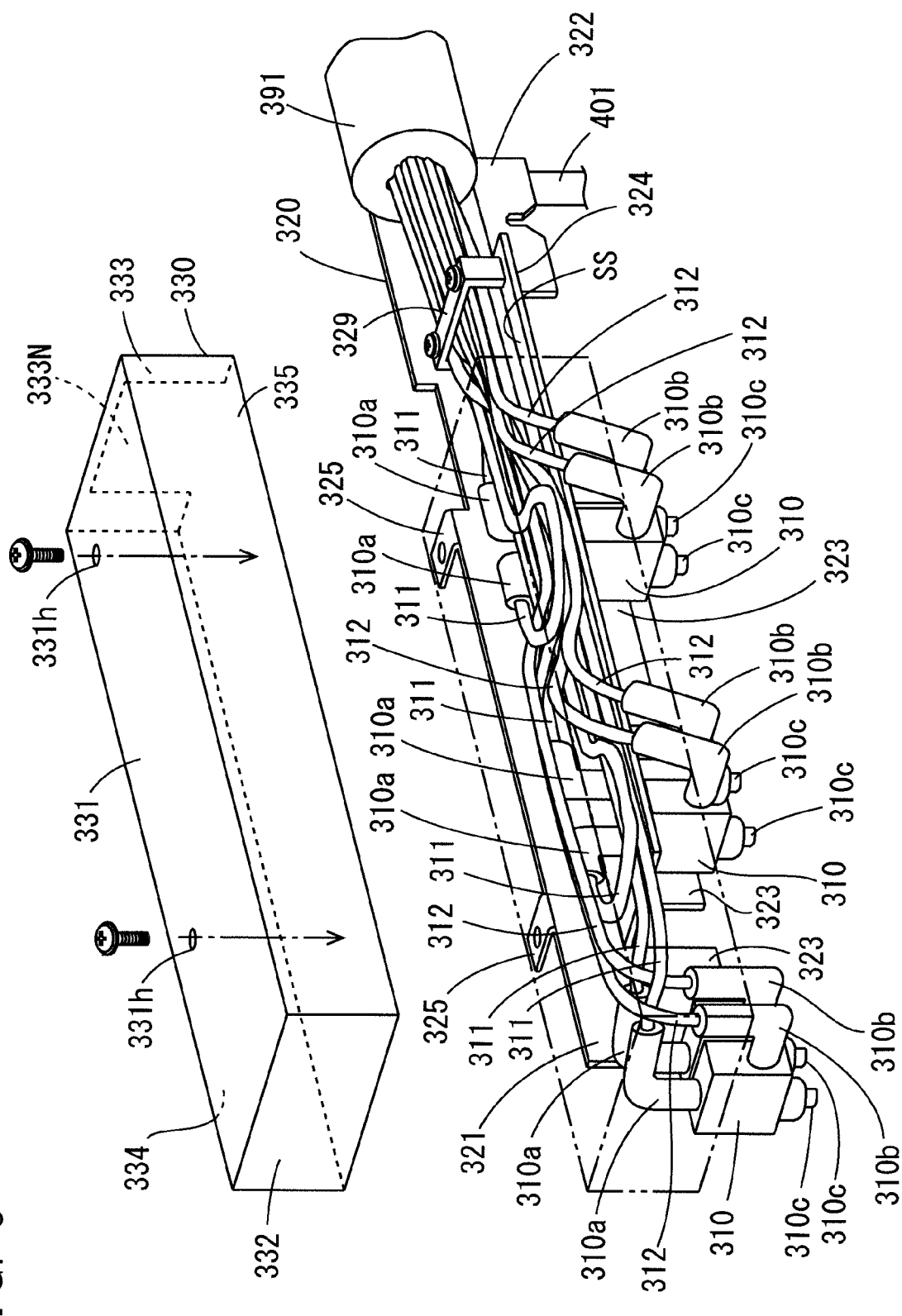

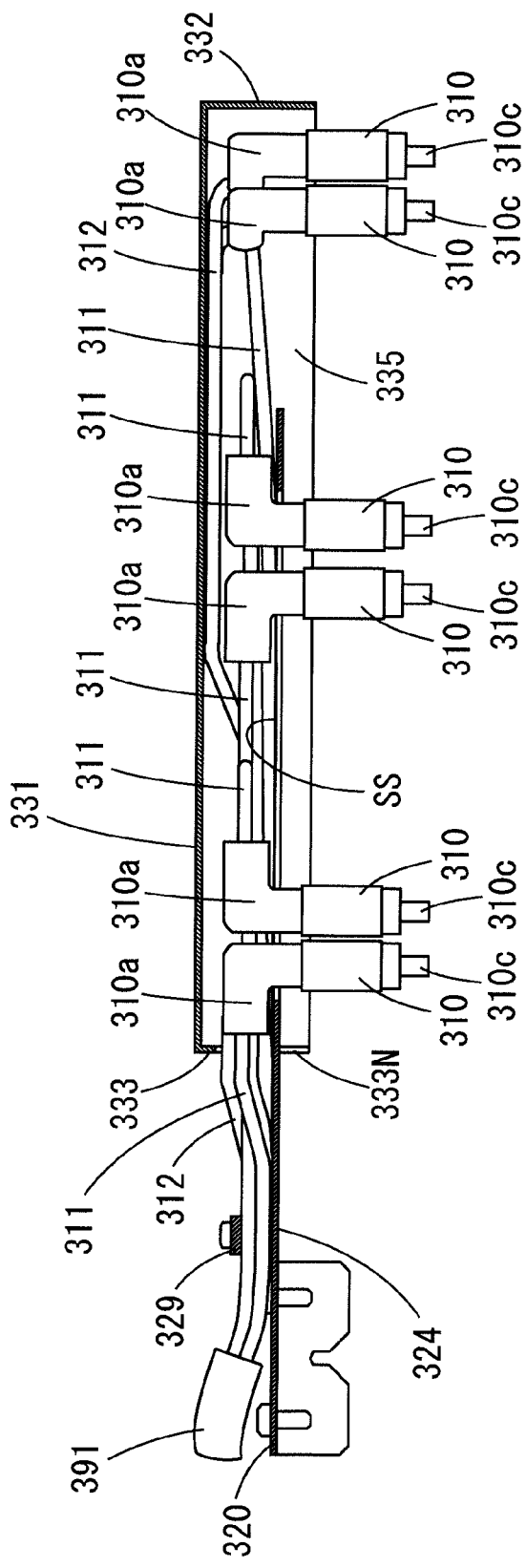
F I G. 6

F I G. 7
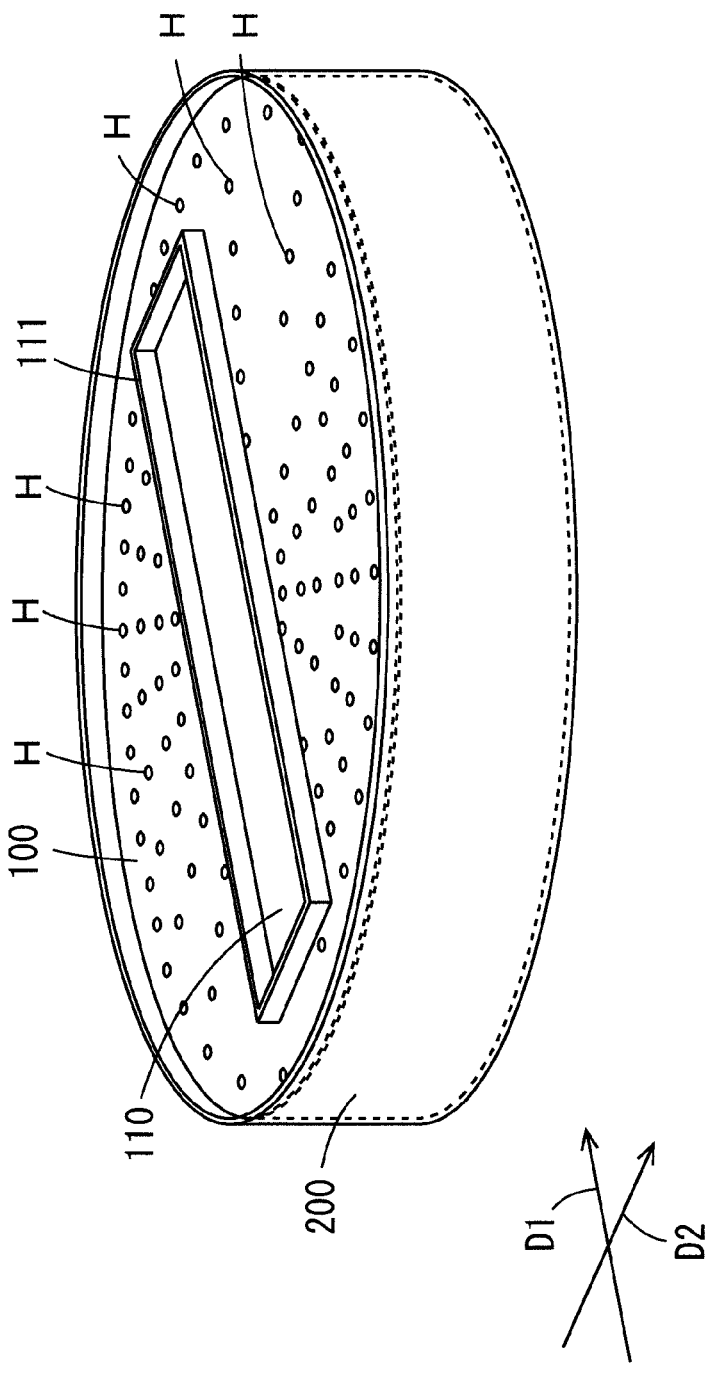

F I G.  8
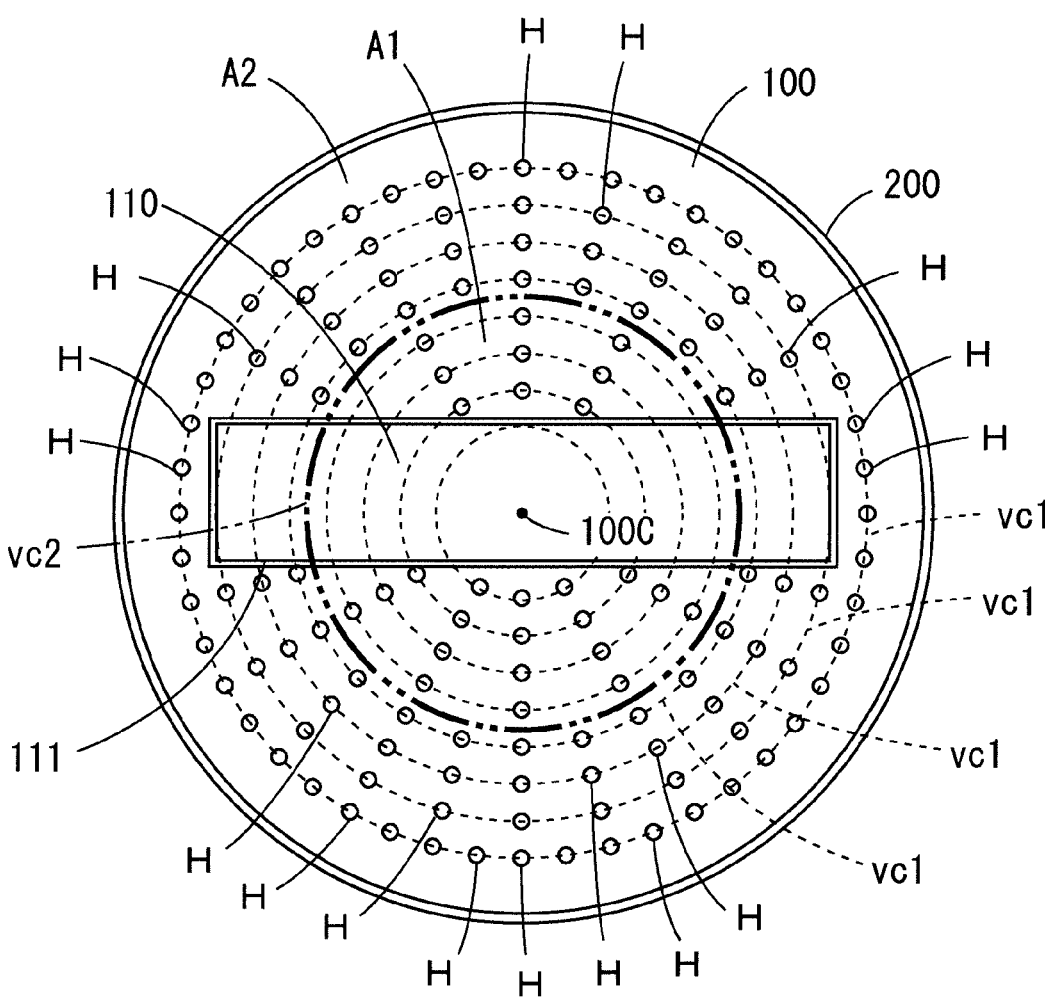
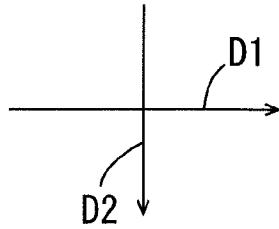

F I G. 9
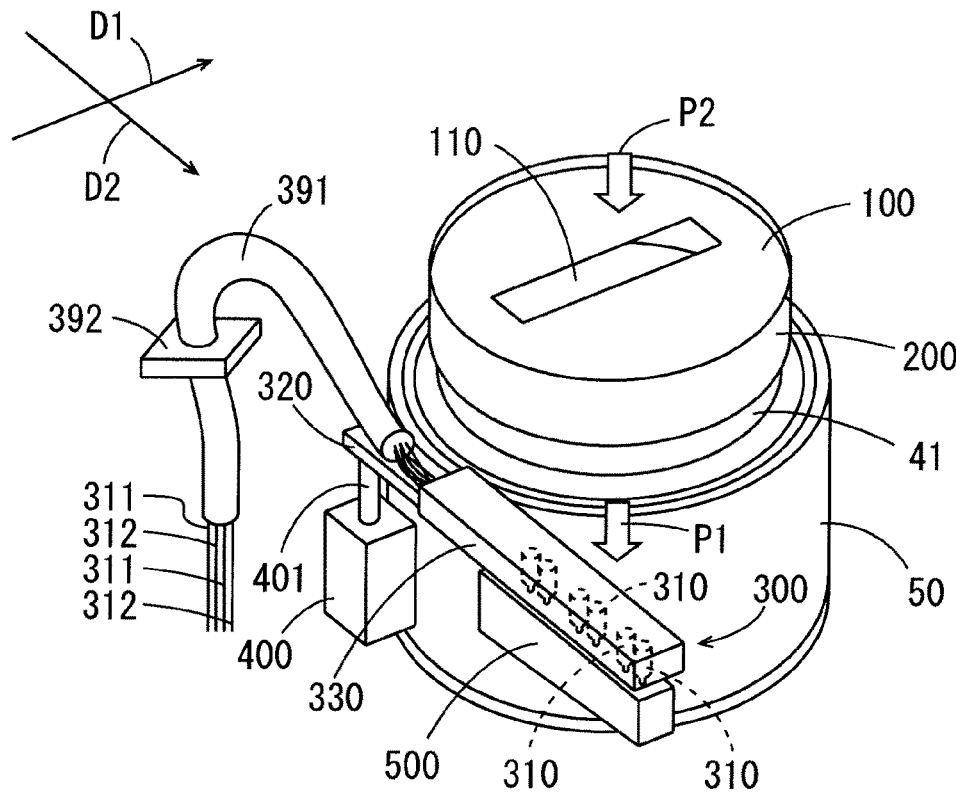
F I G. 10
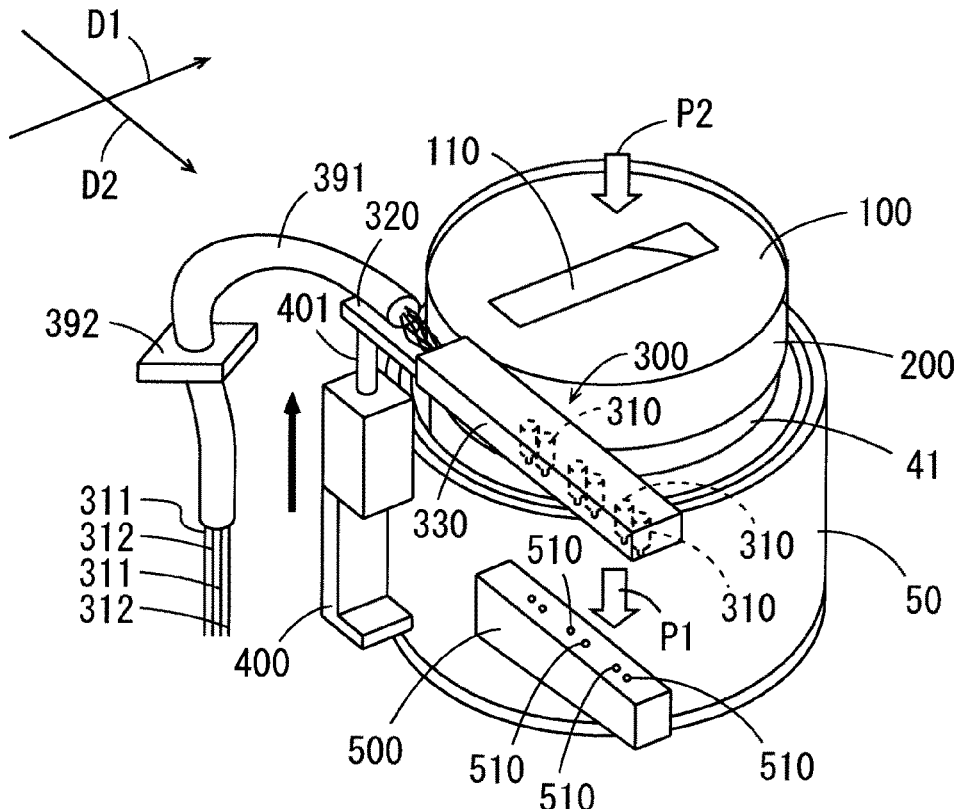

F I G.  1 1
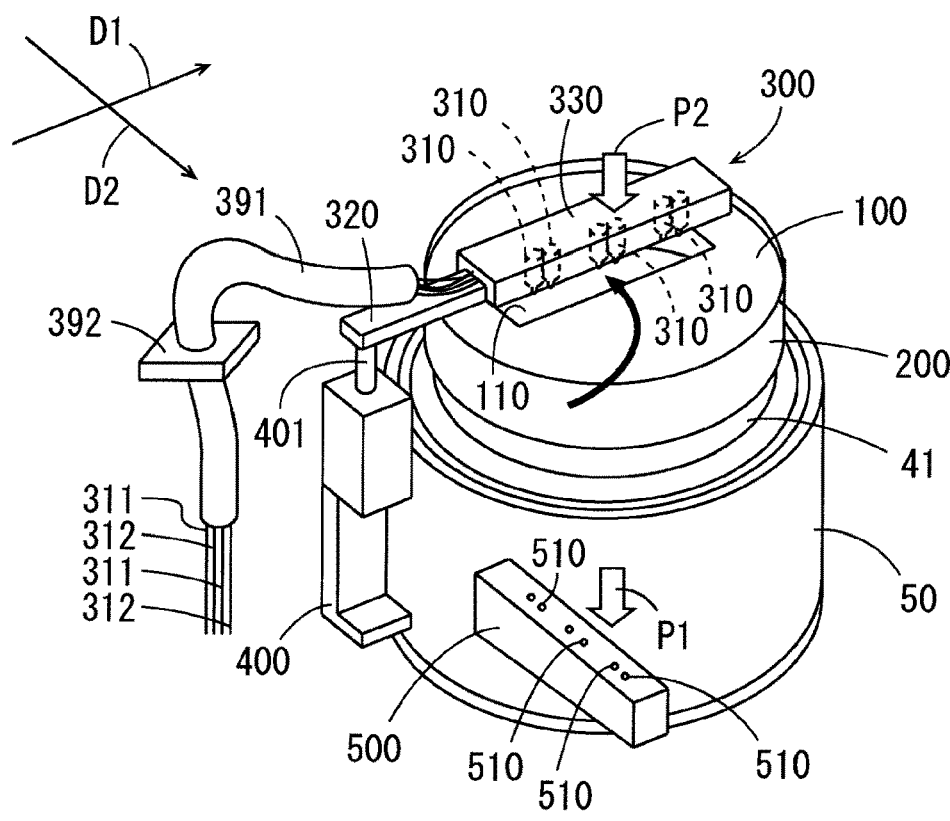
F I G.  1 2
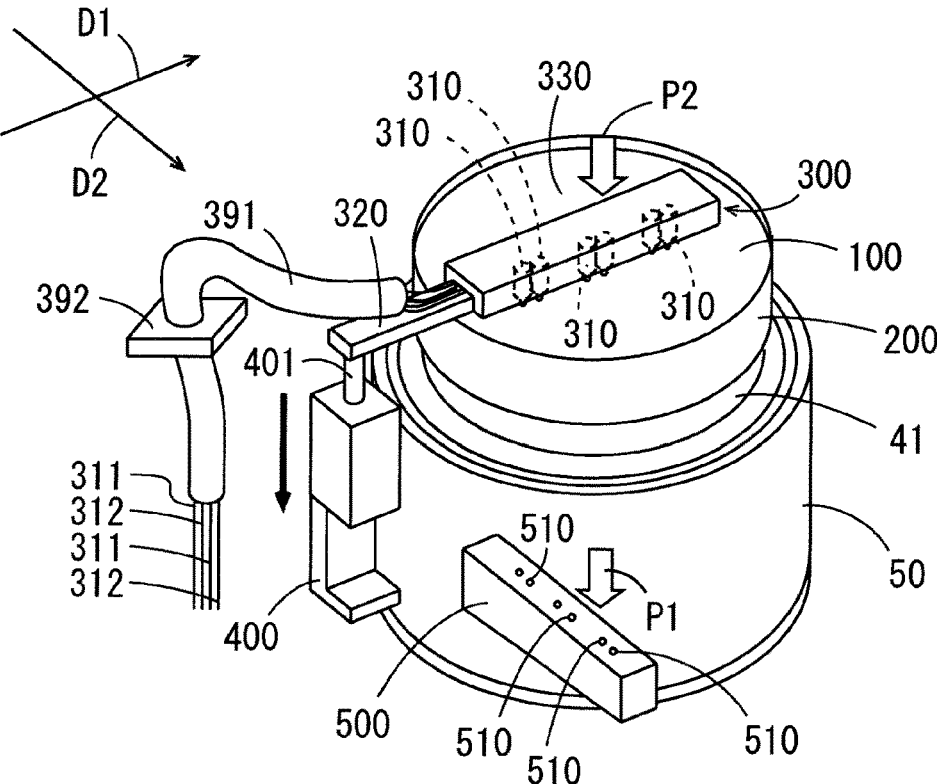

F I G . 1 4
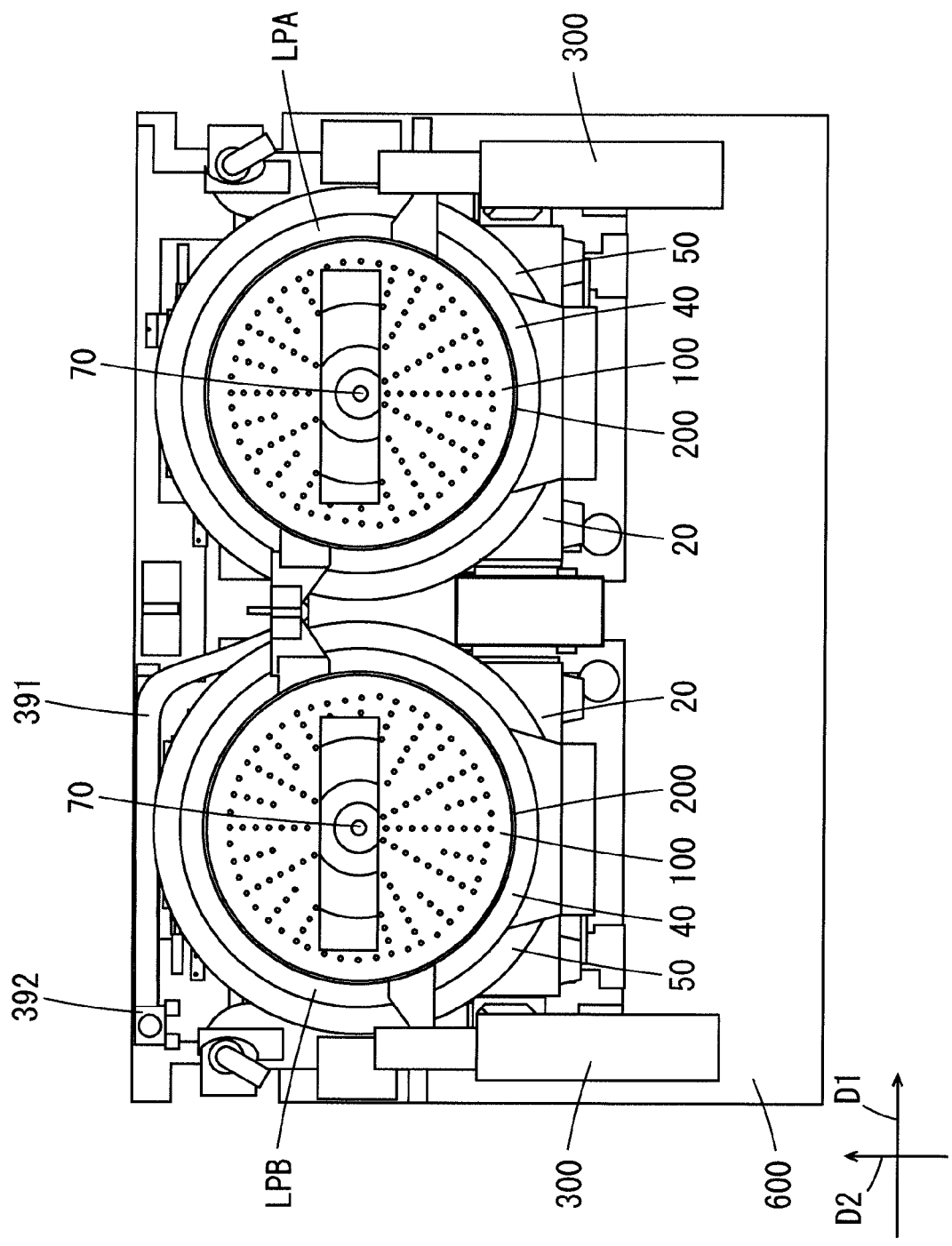

F I G.   1 5
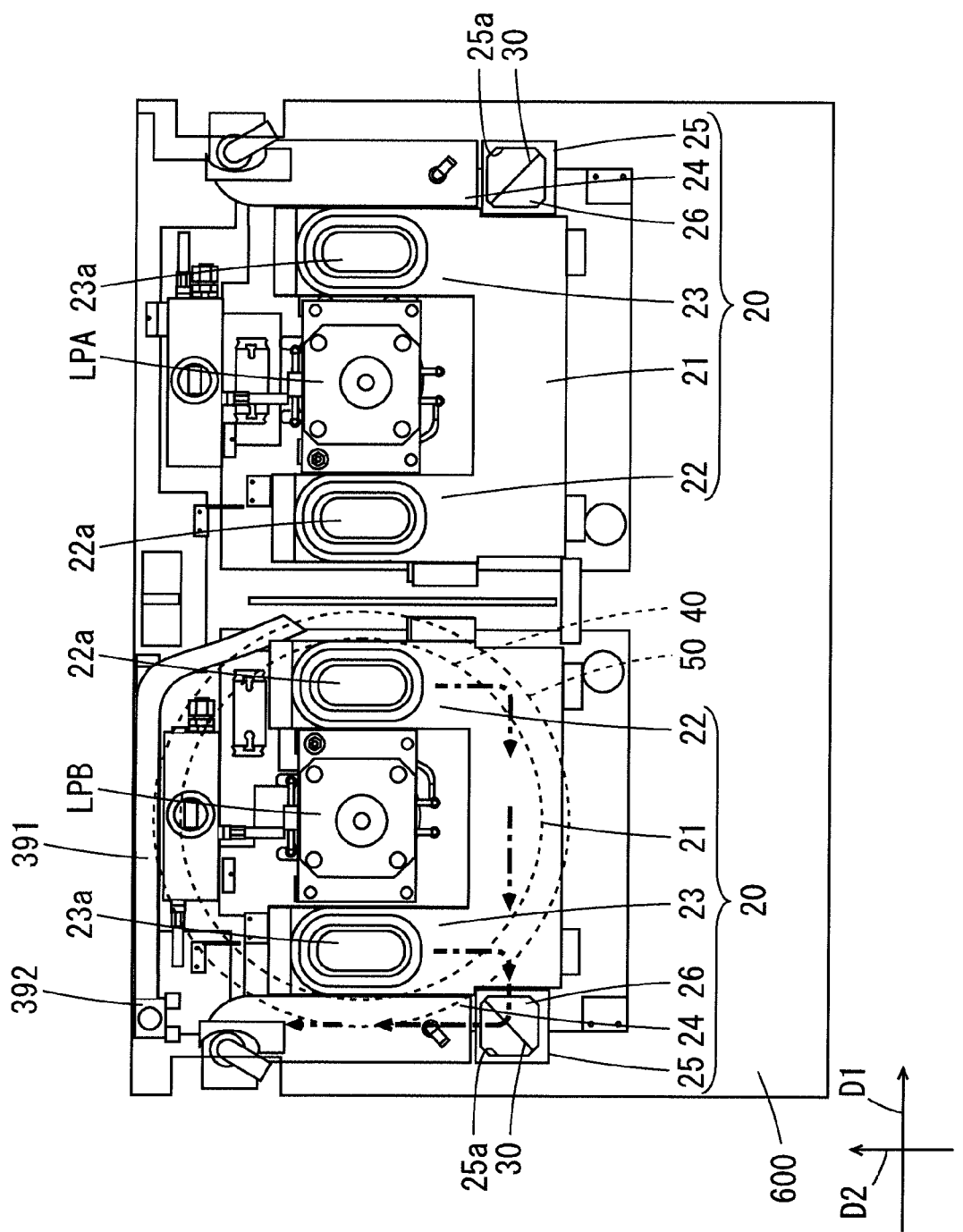

F I G .  1 6
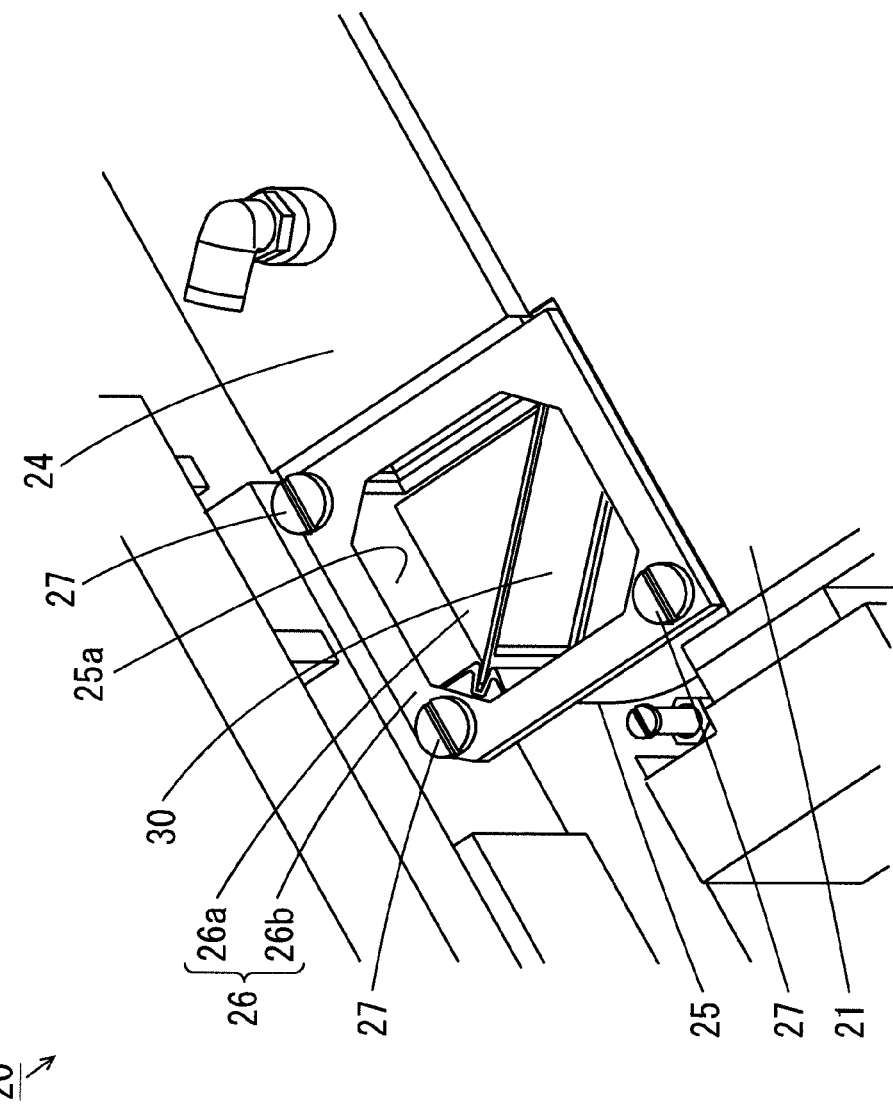

F I G . 1 7
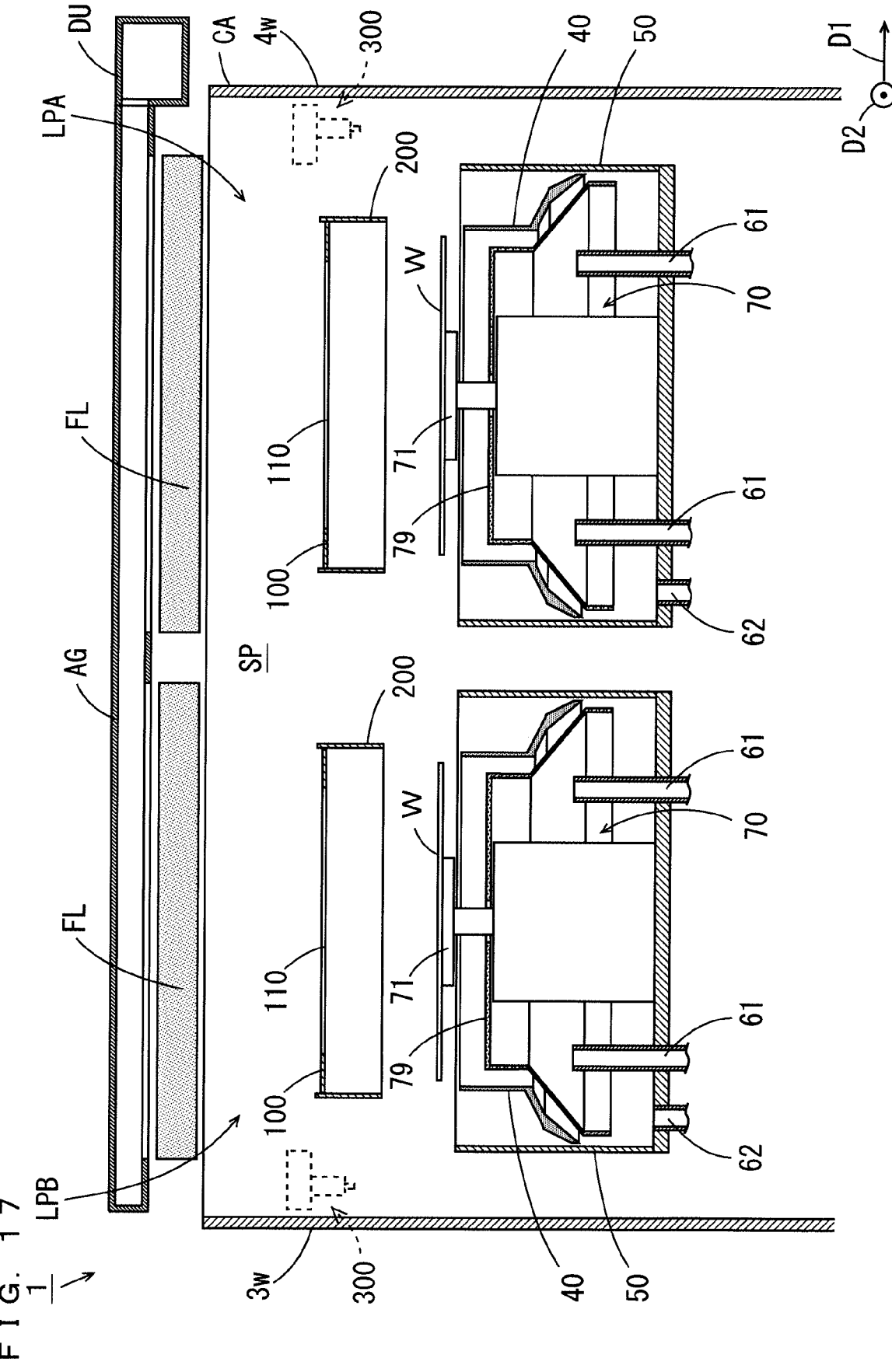

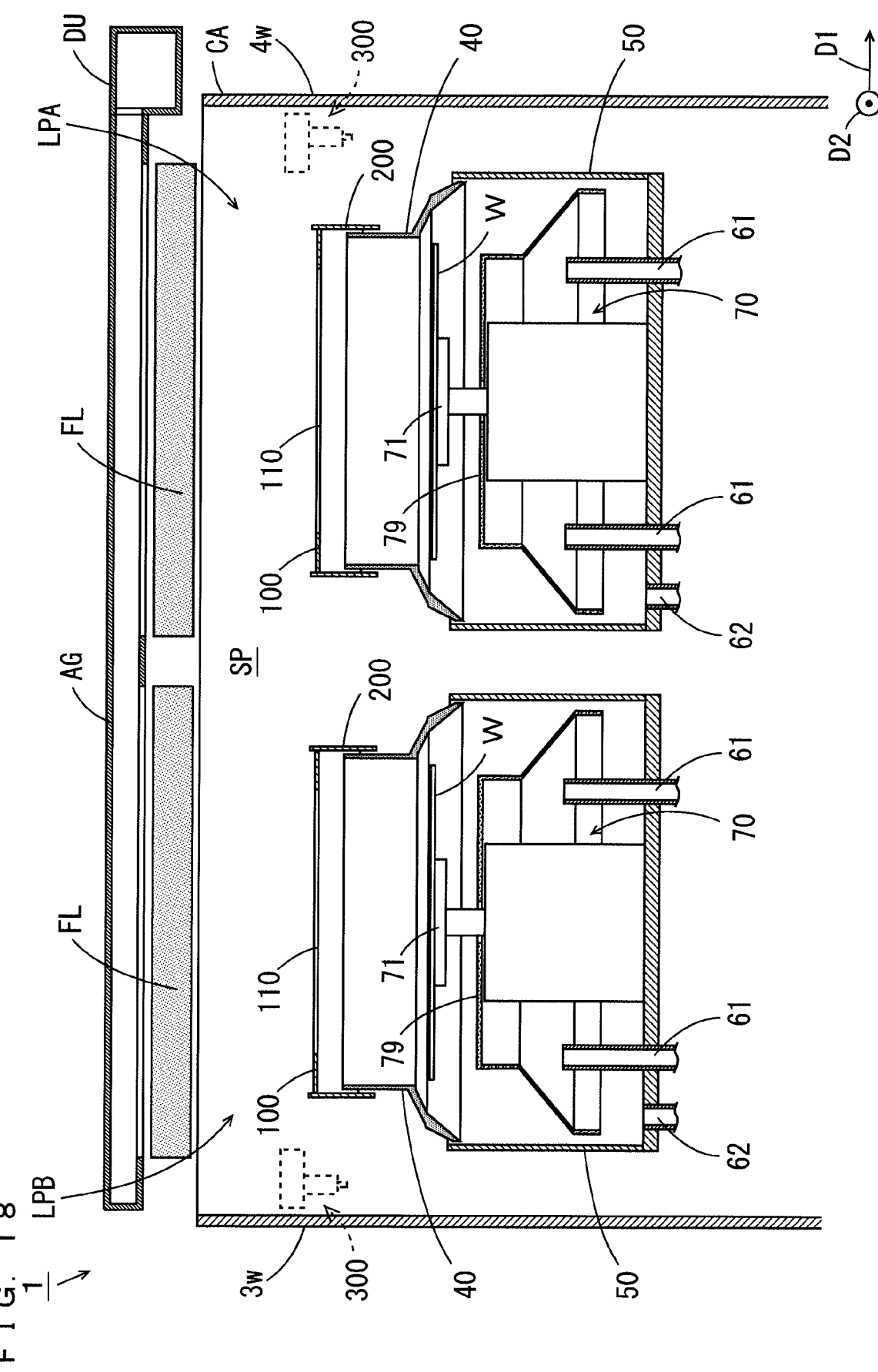
F I G . 1 8

F I G.  2 0
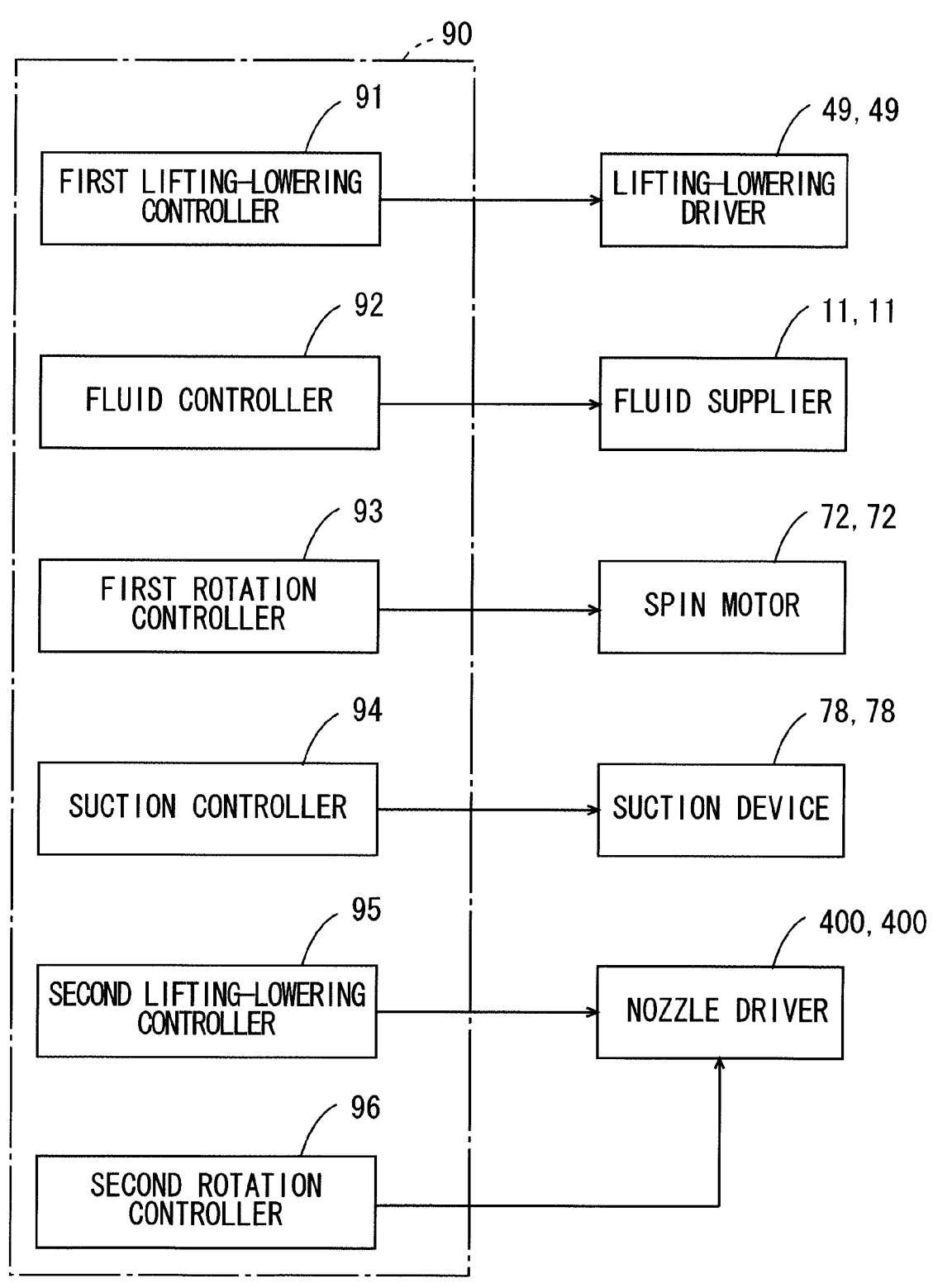

SUBSTRATE PROCESSING APPARATUS

BACKGROUND

Technical Field

The present invention relates to a substrate processing apparatus that performs processing on a substrate using a processing liquid.

Description of Related Art

Conventionally, a substrate processing apparatus is used to perform predetermined processing using a processing liquid on various substrates such as a substrate for an FPD (Flat Panel Display) that is used for a liquid crystal display device, an organic EL (Electro Luminescence) display device or the like, a semiconductor substrate, a substrate for an optical disc, a substrate for a magnetic disc, a substrate for a magneto-optical disc, a substrate for a photomask, a ceramic substrate or a substrate for a solar cell.

For example, a substrate processing apparatus described in JP 10-004050 A includes a spin chuck, a cup and a nozzle. The spin chuck holds and rotates the substrate in a horizontal attitude. The cup is disposed to surround a substrate supported by the spin chuck. An exhaust port for exhausting gas in the cup is formed in a lower portion of the cup. The nozzle supplies a processing liquid to the surface of the substrate from above the spin chuck.

A stage is disposed below the cup. A mist separator serving as a particle collecting means is interposed between a stage and an exhaust port of the cup. Air including particles such as mist in the cup is exhausted from an exhaust port in a lower portion of the cup and supplied to the mist separator. In the mist separator, particles such as mist are collected, and only the gas is supplied to an exhaust box located at a downstream position.

SUMMARY

The mist separator is required to be maintained periodically. In JP 10-004050 A, because the mist separator can be easily detached when the cup is replaced, the efficiency of the maintenance work can be improved. However, in order to further reduce the downtime of the substrate processing apparatus, it is desired to further improve the efficiency of the maintenance work.

An object of the present invention is to provide a substrate processing apparatus that can perform maintenance work efficiently.

A substrate processing apparatus according to one aspect of the present invention includes a cup surrounding a substrate that is being processed with use of a processing liquid, an exhaust duct that has an opening in a portion not overlapping with the cup in a plan view and forms an exhaust flow path for exhausting a gas in the cup, a mist collecting member that is provided at a position overlapping with the opening and collects a mist component of the processing liquid in the exhaust duct, and a lid portion that closes the opening of the exhaust duct.

With the present invention, maintenance work for the substrate processing apparatus can be efficiently performed.

Other features, elements, characteristics, and advantages of the present disclosure will become more apparent from the following description of preferred embodiments of the present disclosure with reference to the attached drawings.

BRIEF DESCRIPTION OF THE DRAWING

FIG. 3 is a schematic plan view for explaining the configuration of part of the liquid processing unit of FIG. 2;

FIG. 4 is a schematic longitudinal cross sectional view for explaining the configuration of part of the liquid processing unit of FIG. 2;

FIG. 5 is a perspective view of a nozzle arm unit of FIG. 2;

FIG. 6 is a longitudinal cross sectional view of a nozzle arm unit taken along a predetermined vertical plane;

FIG. 7 is an external perspective view of a partition plate and a cylindrical member of FIG. 2;

FIG. 8 is a plan view of the partition plate and the cylindrical member of FIG. 2;

FIG. 9 is a diagram for explaining the operation of a nozzle arm unit when a plurality of nozzles move between a waiting position and a processing position;

FIG. 10 is a diagram for explaining the operation of the nozzle arm unit when the plurality of nozzles move between the waiting position and the processing position;

FIG. 11 is a diagram for explaining the operation of the nozzle arm unit when the plurality of nozzles move between the waiting position and the processing position;

FIG. 12 is a diagram for explaining the operation of the nozzle arm unit when the plurality of nozzles move between the waiting position and the processing position;

FIG. 14 is a diagram showing the liquid processing units supported by the unit base body of FIG. 13;

FIG. 15 is a diagram showing an exhaust duct supported by the unit base body of FIG. 13;

FIG. 16 is a partially enlarged perspective view showing the configuration around a bent portion of an exhaust duct of FIG. 15;

FIG. 17 is a schematic longitudinal cross sectional view of the development device when a cup of the liquid processing unit is in a first state;

FIG. 18 is a schematic longitudinal cross sectional view of the development device when the cup of the liquid processing unit is in a second state;

FIG. 20 is a block diagram showing the configuration of a controller of the development device of FIG. 1.

DETAILED DESCRIPTION

A substrate processing apparatus according to embodiments of the present invention will be described below with reference to the drawings. In the following description, a substrate refers to a substrate for an FPD (Flat Panel Display) that is used for a liquid crystal display device, an organic EL (Electro Luminescence) display device or the like, a semiconductor substrate, a substrate for an optical disc, a substrate for a magnetic disc, a substrate for a magneto-optical disc, a substrate for a photomask, a ceramic substrate, a substrate for a solar cell or the like.

A development device will be described as one example of the substrate processing apparatus. A substrate to be subjected to development processing in the present embodiment has a main surface and a back surface. Further, in the development device according to the present embodiment, with the main surface of the substrate directed upwardly and the back surface of the substrate directed downwardly, the back surface (lower surface) of the substrate is held, and development processing is performed on the main surface (upper surface) of the substrate.

A photosensitive film on which exposure processing has been performed is formed at least in the center portion of the main surface of the substrate. This photosensitive film is a negative photosensitive polyimide film, for example. As a development liquid for dissolving the exposed negative photosensitive polyimide film, an organic solvent including cyclohexanone, cyclopentanone or the like is used. As a rinse liquid, an organic solvent including isopropyl alcohol, propylene glycol monomethyl ether acetate (PGMEA) or the like is also used.

In the present embodiment, "development processing for a substrate" means dissolution of part of a photosensitive film by supply of a development liquid to the photosensitive film which is formed on a main surface of a substrate after exposure processing is performed on the photosensitive film.

1. Configuration of Development Device

Figure 1:
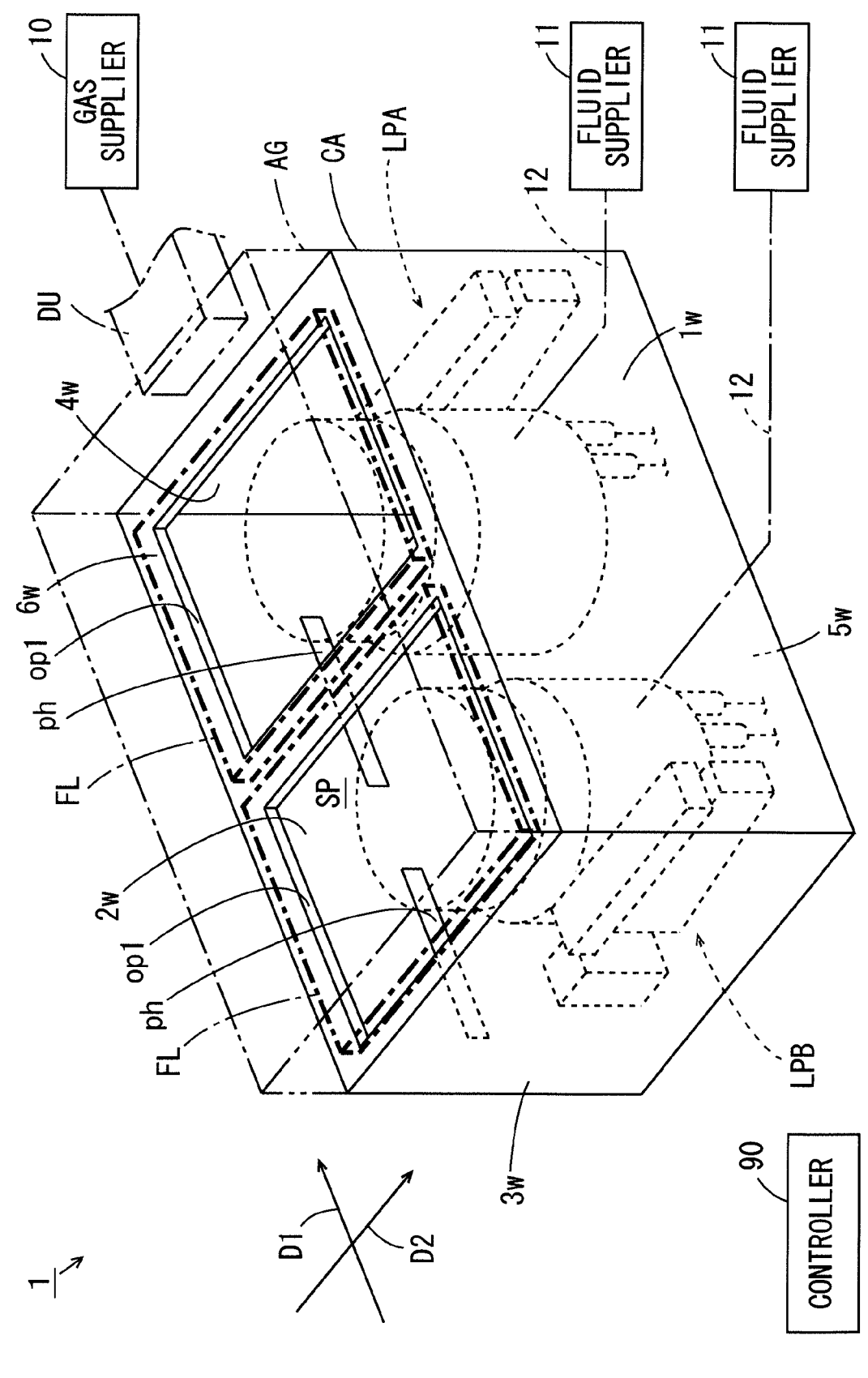
FIG. 1 is a schematic perspective view for explaining the schematic configuration of a development device according to one embodiment of the present invention.

FIG. 1 is a schematic perspective view for explaining the schematic configuration of a development device according to one embodiment of the present invention. As shown in FIG. 1, the development device 1 basically has the configuration in which two liquid processing units LPA, LPB are contained in a casing CA. In FIG. 1, the schematic shapes of the two liquid processing units LPA, LPB are indicated by the dotted lines. Details of the configuration of the liquid processing units LPA, LPB will be described below.

The casing CA has a substantially cuboid box shape extending in one direction in a horizontal plane. Specifically, a first sidewall plate 1w, a second sidewall plate 2w, a third sidewall plate 3w, a fourth sidewall plate 4w, a bottom plate 5w and a top plate 6w are attached to a frame (not shown) to form the casing CA. In the following description, a direction parallel to the direction in which the casing CA extends in a horizontal plane is suitably referred to as a first direction D1, and a direction orthogonal to the first direction D1 in a horizontal plane is suitably referred to as a second direction D2. The two liquid processing units LPA, LPB are arranged on a unit base body, described below, so as to be aligned in the first direction D1 in the casing CA.

The first sidewall plate 1w and the second sidewall plates 2w have a rectangular plate shape and are provided so as to be parallel to the vertical direction and the first direction D1 and face each other. The third sidewall plate 3w and the fourth sidewall plates 4w have a rectangular plate shape and are provided so as to be parallel to the vertical direction and the second direction D2 and face each other.

In the second sidewall plate 2w, two carry-in carry-out ports ph for transporting a substrate between the inside and outside of the casing CA are formed. The two carry-in carry-out ports ph are respectively formed in two portions opposite to the liquid processing units LPA, LPB in the second direction D2 in the second sidewall plate 2w. In the top plate 6w, two openings op1 are formed to be aligned in the first direction D1. The aperture ratio of the two openings op1 in the top plate 6w is set as sufficiently large as the aperture ratio of when the entire upper end of the casing CA is opened upwardly.

Two filters FL are provided above the top plate 6w so as to respectively close the two openings op1 of the top plate 6w. The two filters FL may be provided immediately below the top plate 6w. In FIG. 1, the two filters FL are indicated by the thick one-dot and dash lines. The two filters FL are ULPA (Ultra-Low Penetration Air) filters, for example, and are attached to a frame (not shown) that constitutes the casing CA or the top plate 6w. An air guide AG is provided on the top plate 6w of the casing CA so as to surround the two filters FL. In FIG. 1, the air guide AG is indicated by the two-dots and dash lines.

A gas supplier 10 is provided outside of the casing CA. The gas supplier 10 is an air control unit, for example, and regulates the conditions of air such as a temperature and humidity so as to satisfy a predetermined condition during power-on of the development device 1. Further, the gas supplier 10 supplies air the conditions of which are regulated to the air guide AG through an air supply duct DU. In this case, the air guide AG guides air supplied from the gas supplier 10 to the two openings op1 of the top plate 6w through the two filters FL. Thus, a clean air the temperature, humidity and the like of which are regulated is supplied into the casing CA, and a downward airflow is generated in an entire inner space SP of the casing CA.

Two fluid suppliers 11 are further provided outside of the casing CA. Each fluid supplier 11 includes a development liquid supply source, a rinse liquid supply source, a gas supply source and various fluid-related elements and supplies a development liquid, a rinse liquid and gas to the liquid processing units LPA, LPB through a fluid supply path 12. In FIG. 1, each fluid supply path 12 is indicated by the one-dot and dash line. In the present embodiment, the fluid supply path 12 is constituted by one or a plurality of pipes, a valve and the like.

The development device 1 further includes a controller 90. The controller 90 includes a CPU (Center Processing Unit) and a memory, or a microcomputer, for example, and controls the liquid processing units LPA, LPB and the two fluid suppliers 11. Details of the controller 90 will be described below.

Figure 2:
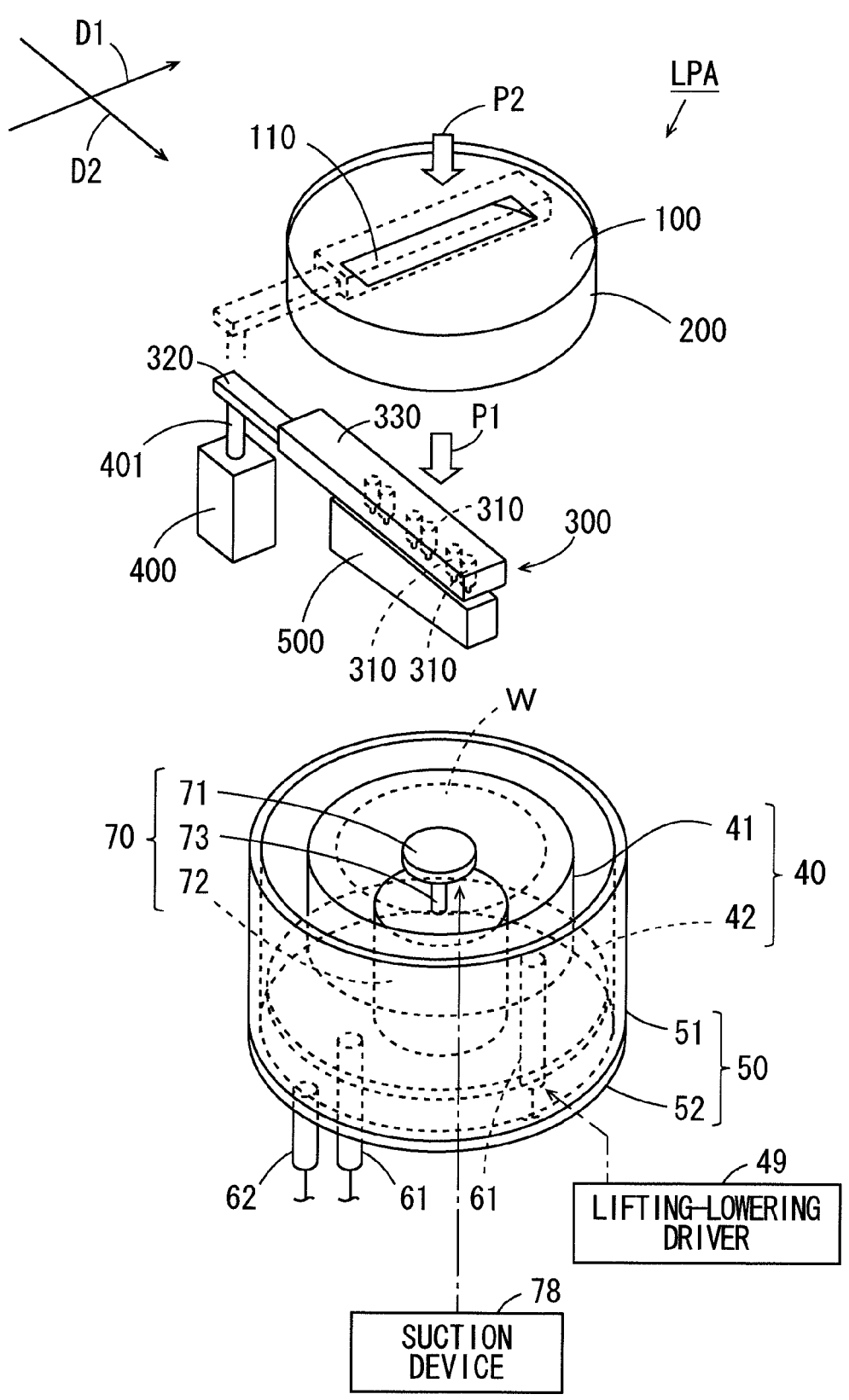
FIG. 2 is a partially exploded perspective view for explaining the configuration of a liquid processing unit of FIG. 1.

2. Configuration of Liquid Processing Units (1) Outline of Configuration of Liquid Processing Units The two liquid processing units LPA, LPB of FIG. 1 basically have the same configuration except that parts of constituent elements are provided to be symmetrical to each other with respect to a plane (vertical plane) orthogonal to the first direction D1. The configuration of the liquid processing unit LPA out of the two liquid processing units LPA, LPB will be described below representatively. FIG. 2 is a partially exploded perspective view for explaining the configuration of the liquid processing unit LPA of FIG. 1. FIG. 3 is a schematic plan view for explaining the configuration of part of the liquid processing unit LPA of FIG. 2. FIG. 4 is a schematic longitudinal cross sectional view for explaining the configuration of part of the liquid processing unit LPA of FIG. 2. In FIGS. 2 to 4, a substrate W to be processed is indicated by the dotted lines.

As shown in FIG. 2, the liquid processing unit LPA includes a partition plate 100, a cylindrical member 200, a nozzle arm unit 300, a nozzle driver 400 and a waiting pod 500. Further, the liquid processing unit LPA further includes a cup 40, a lifting-lowering driver 49, a container 50, exhaust pipes 61, a drain pipe 62, a substrate holding device 70 and a suction device 78. In FIG. 2, in order to facilitate understanding of the structure of the plurality of constituent elements, parts of the constituent elements are shown in the upper field, and the rest of the constituent elements is shown in the lower field.

Specifically, in FIG. 2, the parts of the constituent elements including the partition plate 100, the cylindrical member 200, the nozzle arm unit 300, the nozzle driver 400 and the waiting pod 500 are shown in the upper field, and the rest of the constituent elements including the cup 40, the container 50 and the substrate holding device 70 is shown in the lower field. In FIGS. 3 and 4, the schematic plan view and the schematic longitudinal cross sectional view of the cup 40, the container 50 and the substrate holding device 70 are respectively shown as the partial configuration of the liquid processing unit LPA.

(2) Cup and Container

In the casing CA of FIG. 1, the container 50 is fixed to the below-mentioned unit base body. As shown in FIG. 2, the container 50 includes a sidewall portion 51 and a bottom portion 52. The sidewall portion 51 has an annular horizontal cross section, and is formed to extend in the vertical direction while having a constant inner diameter and a constant outer diameter. The bottom portion 52 is formed so as to close the lower end of the sidewall portion 51.

Three through holes are formed in the bottom portion 52. Two through holes out of the three through holes are opposite to each other with the substrate holding device 70 interposed therebetween. The exhaust pipes 61 are respectively connected to the portions in which these two through holes are formed. Each exhaust pipe 61 guides an atmosphere in the casing CA to an exhaust device (not shown) provided outside of the casing CA through an exhaust duct, described below. In the container 50, an end portion (opening end) of the exhaust pipe 61 is located farther upwardly than the bottom portion 52.

The drain pipe 62 is further connected to the portion in which the remaining through hole is formed in the bottom portion 52. During the development processing for the substrate W, the drain pipe 62 guides liquids (a development liquid and a rinse liquid) flowing from the cup 40 to the bottom portion of the container 50 to a drain device (not shown) provided outside of the casing CA as described below. In the container 50, the end portion (opening end) of the drain pipe 62 is located farther downwardly than the end portion of each exhaust pipe 61.

At least a lower portion of the substrate holding device 70 is contained in the container 50. Specifically, the substrate holding device 70 includes a suction holder 71, a spin motor 72 and a motor cover 79 (FIG. 4). In FIGS. 2 and 3, the motor cover 79 is not shown. As shown in FIG. 3, the spin motor 72 is fixed to the bottom portion 52 so as to be located at the center of the container 50 in a plan view. In the present example, a lower portion of the spin motor 72 projects farther downwardly than the bottom portion 52. As shown in FIG. 4, a rotation shaft 73 is provided at the spin motor 72 to extend upwardly. The suction holder 71 is provided at the upper end of the rotation shaft 73. The suction holder 71 projects farther upwardly than the upper end of the container 50.

As shown in FIG. 2, the suction device 78 is provided outside of the container 50. The suction holder 71 is configured to be capable of sucking the center portion of the back surface of the substrate W due to an operation of the suction device 78. The suction holder 71 sucks the center portion of the back surface of the substrate W, so that the substrate W is held in a horizontal attitude at a position above the container 50. Further, the spin motor 72 is operated with the substrate W held by suction by the suction holder 71, so that the substrate W is rotated in a horizontal attitude.

As shown in FIG. 4, the motor cover 79 substantially has a bowl shape, and is fixed to the container 50 such that a portion that is opened and has a large diameter is directed downwardly. A through hole into which the rotation shaft 73 is insertable is formed in the center portion of the upper end of the motor cover 79. With the rotation shaft 73 inserted into the through hole in the center portion of the upper end of the motor cover 79, the motor cover 79 covers an upper end portion of the spin motor 72 excluding the rotation shaft 73 and a space having a constant width and surrounding the spin motor 72 in a horizontal plane from above. A gap having a constant width is formed between the outer peripheral end of the motor cover 79 and the inner peripheral surface of the sidewall portion 51.

Here, the above-mentioned end portion of each exhaust pipe 61 is located below the motor cover 79. This prevents the liquids (the development liquid and the rinse liquid) falling from above the container 50 from entering each exhaust pipe 61 during the development processing for the substrate W.

As shown in FIG. 2, at least the lower end of the cup 40 is contained in the container 50 in addition to the lower portion of the substrate holding device 70. Here, the cup 40 is configured to be movable in the vertical direction in the container 50. Further, the cup 40 includes a cylindrical wall portion 41 and a liquid receiving portion 42. Each of the cylindrical wall portion 41 and the liquid receiving portion 42 has an annular horizontal cross section and is provided to extend at least in the vertical direction. As shown in FIG. 3, the cup 40 is configured to surround the substrate holding device 70 in a plan view.

As shown in FIG. 4, the outer diameter and the inner diameter of the liquid receiving portion 42 gradually increase downwardly from the upper end of the liquid receiving portion 42. The outer diameter of the lower end of the liquid receiving portion 42 (the largest outer diameter of the liquid receiving portion 42) is smaller than the inner diameter of the sidewall portion 51 of the container 50. Therefore, a gap having a constant width is formed between the outer peripheral end of the liquid receiving portion 42 and the inner peripheral surface of the sidewall portion 51. The cylindrical wall portion 41 has a constant inner diameter and a constant outer diameter and is formed to extend upwardly from the upper end of the liquid receiving portion 42.

As shown in FIG. 2, the lifting-lowering driver 49 is provided in the vicinity of the container 50 in the casing CA of FIG. 1. The lifting-lowering driver 49 includes a driving mechanism such as a motor or an air cylinder, and changes the cup 40 between a first state and a second state by supporting the cup 40 and vertically moving the cup 40. The first state and the second state of the cup 40 will be described below.

(3) Nozzle Driver and Waiting Pod

In the casing CA of FIG. 1, the nozzle driver 400 is provided to be adjacent to the container 50 in the first direction D1. The nozzle driver 400 includes a motor having a rotation shaft 401 and an actuator. The actuator includes an air cylinder, a hydraulic cylinder, a motor or the like and supports the motor on the unit base body such that the motor having the rotation shaft 401 is movable in the vertical direction. The rotation shaft 401 is located at the upper end of the nozzle driver 400.

In the casing CA of FIG. 1, the waiting pod 500 is further provided on the unit base body. The nozzle driver 400 and the waiting pod 500 are aligned in the second direction D2 close to the container 50 with a distance therebetween. The waiting pod 500 has a box shape extending by a constant length in the second direction D2. A plurality of waiting holes for containing injecting portions of a plurality of nozzles 310, described below, are formed in the upper surface of the waiting pod 500.

A drain pipe (not shown) that drains a liquid injected or falling from the plurality of nozzles 310 to the outside of the casing CA when the plurality of nozzles 310 are waiting is connected to the waiting pod 500. Further, an exhaust pipe (not shown) that exhausts an atmosphere in the waiting pod 500 to the outside of the casing CA is connected to the waiting pod 500.

(4) Nozzle Arm Unit

The nozzle arm unit 300 is attached to the upper end of the rotation shaft 401. The nozzle arm unit 300 has a longitudinal shape extending linearly in a direction different from the direction in which the rotation shaft 401 extends while being attached to the upper end of the rotation shaft 401. The nozzle arm unit 300 is mainly constituted by the plurality (six in the present example) of nozzles 310, a support 320 and a cover member 330.

FIG. 5 is a perspective view of the nozzle arm unit 300 of FIG. 2. FIG. 6 is a longitudinal cross sectional view of the nozzle arm unit 300 taken along a predetermined vertical plane. In FIG. 5, the cover member 330 being separated from the rest of the constituent elements is shown to facilitate understanding of the inner structure of the nozzle arm unit 300.

The support 320 is fabricated by suitable bending of one metal plate that has been cut or laser-processed into a predetermined shape, for example. Alternatively, the support 320 is fabricated by connection of a plurality of metal plates processed into a predetermined shape by screwing, welding or the like. Further, the support 320 is formed to extend in one direction and has one end portion 321 and another end portion 322. Further, the support 320 has three nozzle fixing portions 323 which are arranged from the vicinity of the one end portion 321 toward the other end portion 322 at intervals. Two nozzles 310 are attached to each of the three nozzle fixing portions 323. Further, the support 320 includes a pipe fixing portion 324 and two cover attachment portions 325. The pipe fixing portion 324 is located in the vicinity of the other end portion 322. The pipe fixing portion 324 and the cover attachment portions 325 will be described below.

One of the two nozzles 310 provided at each nozzle fixing portion 323 is used to supply the development liquid to the substrate W. Further, the other one of the two nozzles 310 provided at each nozzle fixing portion 323 is used to supply the rinse liquid to the substrate W. Further, each of all of the nozzles 310 according to the present embodiment is a soft spray-type two-fluid nozzle capable of injecting a fluid mixture of liquid and gas. Therefore, each nozzle 310 has two fluid introducing portions 310*a*, 310*b* for introducing liquid and gas into the nozzle 310, and an injecting portion 310*c* for injecting a fluid mixture.

Each nozzle 310 is fixed to the support 320 with the injecting portion 310*c* directed downwardly. In this state, the fluid introducing portion 310*a* for introducing liquid into the nozzle 310 is provided at the upper end of each nozzle 310.

Further, the fluid introducing portion 310*b* for introducing gas into the nozzle 310 is provided at a side portion of each nozzle 310.

One end of a pipe 311 for supplying liquid (the development liquid or the rinse liquid in the present example) to the nozzle 310 is connected to the fluid introducing portion 310*a* of each nozzle 310. Further, one end of a pipe 312 for supplying gas (a nitrogen gas in the present example) to the nozzle 310 is connected to the fluid introducing portion 310*b* of each nozzle 310. The pipes 311, 312 are formed of a flexible resin material. Examples of such a resin material are PTFE (polytetrafluoroethylene), PVC (polyvinyl chloride), PPS (polyphenylene sulfide), PFA (tetrafluoroethylene-per-fluoroalkylvinylether copolymer) and the like.

The other end portion 322 of the support 320 is attached to the upper end of the rotation shaft 401 of the nozzle driver 400. In this state, a horizontal flat support surface SS is formed at the substantially center portion in the longitudinal direction of the support 320. Part of each of the plurality of pipes 311, 312 is provided so as to extend on the support surface SS from the nozzle 310 to which the pipe is connected toward the pipe fixing portion 324.

The pipe fixing portion 324 is constituted by part of the support surface SS. In the pipe fixing portion 324, the plurality of pipes 311, 312 are bound. In this state, a pipe fixing piece 329 having an inverted U-shape is screwed onto the support surface SS constituting the pipe fixing portion 324. Therefore, the plurality of pipes 311, 312 are fixed in the vicinity of the other end portion 322 of the support 320. Portions of the plurality of pipes 311, 312 extending outwardly of the support 320 from the pipe fixing portion 324 are contained in a protection pipe 391 while being bound. The protection pipe 391 is formed of rubber or resin, for example, and is flexible.

The cover member 330 has a box shape with an open bottom portion. Specifically, the cover member 330 of the present example includes an upper surface portion 331, one end-surface portion 332, another end-surface portion 333, one side-surface portion 334 and another side-surface portion 335. The upper surface portion 331 is an oblong that is larger than a nozzle opening of the below-mentioned partition plate 100 in a plan view. The one end-surface portion 332, the other end-surface portion 333, the one side-surface portion 334 and the other side-surface portion 335 extend respectively downwardly from the four sides of the outer edge of the upper surface portion 331. The one end-surface portion 332 and the other end-surface portion 333 face each other, and the one side-surface portion 334 and the other side-surface portion 335 face each other. A cutout 333N is formed in the other end-surface portion 333.

As described above, the support 320 has the two cover attachment portions 325. The two cover attachment portions 325 are located at the upper end of the support 320. A screw hole is formed in each cover attachment portion 325. In the upper surface portion 331 of the cover member 330, through holes 331*h* are formed in two portions corresponding to the two cover attachment portions 325 of the support 320.

With the plurality of nozzles 310 attached to the support 320, the plurality of pipes 311, 312 connected to the plurality of nozzles 310 and the plurality of pipes 311, 312 fixed, the cover member 330 is attached to the support 320. Specifically, the two through holes 331*h* of the cover member 330 are positioned on the two cover attachment portions 325 of the support 320, and the cover member 330 is screwed to the support 320.

Thus, a portion of the support 320 from the one end portion 321 to the vicinity of the other end portion 322 is covered by the cover member 330 from above and the side. On the other hand, the remaining portion of the support 320 is drawn out through the cutout 333N formed in the other end-surface portion 333 of the cover member 330. In this manner, the part of the support 320 is contained in the cover member 330. Further, part of the plurality of nozzles 310 supported by the support 320 is contained in the cover member 330. Further, part of the plurality of pipes 311, 312 supported by the support 320 is contained in the cover member 330. In FIG. 5, the cover member 330 being attached to the support 320 is indicated by the two-dots and dash lines.

Here, in the support 320, the pipe fixing portion 324 is located between the other end portion 322 of the support 320 and the other end-surface portion 333 of the cover member 330. The pipe fixing piece 329 binds the plurality of pipes 311, 312 and fixes them to the pipe fixing portion 324 such that the plurality of pipes 311, 312 drawn out from the cover member 330 do not come into contact with the inner edge of the cutout 333N of the other end-surface portion 333. As shown in FIG. 6, with the cover member 330 attached to the support 320, a large portion of each nozzle 310 except for the fluid introducing portion 310a projects downwardly of the cover member 330.

(5) Partition Plate and Cylindrical Member

FIG. 7 is an external perspective view of the partition plate 100 and the cylindrical member 200 of FIG. 2. FIG. 8 is a plan view of the partition plate 100 and the cylindrical member 200 of FIG. 2. As shown in FIGS. 7 and 8, the cylindrical member 200 has a cylindrical shape and is fixed to part of the casing CA (FIG. 1) via a bracket (not shown). The inner diameter of the cylindrical member 200 is larger than the outer diameter of the cylindrical wall portion 41 (FIG. 3) of the cup 40. Further, the cylindrical member 200 is positioned such that the center axis of the cylindrical member 200 coincides or substantially coincides with the center axis of the cup 40 in a plan view. Thus, in a case in which the cup 40 is lifted, for example, it is possible to insert the upper end of the cup 40 into the cylindrical member 200 while preventing the cup 40 from coming into contact with the cylindrical member 200.

The partition plate 100 has a substantially disc shape and is attached to the cylindrical member 200 so as to come into contact with the entire inner peripheral surface of the cylindrical member 200 in the vicinity of the upper end of the cylindrical member 200. The oblong nozzle opening 110 extending in the first direction D1 is formed in the substantially center portion of the partition plate 100. The nozzle opening 110 is opposite to the center portion of the substrate W held by the substrate holding device 70 during the development processing for the substrate W. As shown in FIG. 7, a wall portion 111 extending upwardly from the inner edge of the nozzle opening 110 by a constant length (about 5 mm to 10 mm, for example) is formed in the portion of the partition plate 100 in which the nozzle opening 110 is formed.

Further, as shown in FIG. 8, a plurality of through holes H are formed in the partition plate 100 so as to be dispersed over the entire partition plate 100 except for the nozzle opening 110. The number and size of the plurality of through holes H formed in the partition plate 100 are defined in consideration of the pressure relationship between a processing space and a non-processing space, described below.

Specifically, in regard to the arrangement of the plurality of through holes H, as indicated by the dotted lines in FIG. 8, concentric circles (a plurality of virtual circles vc1) having a predetermined pitch are defined on the basis of a partition plate center 100C in a plan view. In this case, the plurality of through holes H are dispersedly formed so as to be arranged at equal intervals on each virtual circle vc1. Further, the number of through holes H formed on the largest virtual circle vc1 among the plurality of virtual circles vc1 is larger than the number of through holes H formed on each of the rest of the virtual circles vc1. Further, in the present example, only the largest virtual circle vc1 among the plurality of virtual circles vc1 surrounds the entire nozzle opening 110. Therefore, in the largest virtual circle vc1, a plurality of through holes H are formed so as to be arranged at constant intervals over the entire virtual circle vc1.

Further, as indicated by the thick two-dots and dash line in FIG. 8, a virtual circle vc2 having a radius of ½ of the radius of the partition plate 100 is defined with the partition plate center 100C as the center. Here, in a case in which the inner region of the virtual circle vc2 is a center region A1, and the outer region of the virtual circle vc2 is an outer peripheral region A2, the number of the through holes H formed in the outer peripheral region A2 is larger than the number of the through holes H formed in the center region A1.

(6) Operation of Nozzle Arm Unit

As described above, the nozzle arm unit 300 is attached to the rotation shaft 401 of the nozzle driver 400. Therefore, when the motor of the nozzle driver 400 moves in the vertical direction, the nozzle arm unit 300 moves in the vertical direction. Further, when the motor of the nozzle driver 400 is operated, the nozzle arm unit 300 rotates in a horizontal plane around the rotation shaft 401. Thus, the plurality of nozzles 310 of the nozzle arm unit 300 are held at a waiting position P1 close to the substrate W held by the substrate holding device 70 in a period during which the developing processing is not performed on the substrate W. Further, the plurality of nozzles 310 are held at a processing position P2 above the substrate W held by the substrate holding device 70 in a period during which the developing processing is performed on the substrate W. In FIG. 2, the waiting position P1 and the processing position P2 are respectively indicated by the outlined arrows.

FIGS. 9 to 12 are diagrams for explaining the operation of the nozzle arm unit 300 when the plurality of nozzles 310 move between the waiting position P1 and the processing position P2. In FIGS. 9 to 12, the states of the nozzle arm unit 300 and its peripheral members of when the plurality of nozzles 310 move from the waiting position P1 to the processing position P2 are shown in external perspective views in a chronological order. In the partition plate 100 shown in each of FIGS. 9 to 12, similarly to the example of FIG. 2, the plurality of through holes H are not shown.

First, as shown in FIG. 9, with the plurality of nozzles 310 located at the waiting position P1, the nozzle arm unit 300 is located close to the partition plate 100 and the cylindrical member 200 and held while extending parallel to the second direction D2. At this time, the nozzle arm unit 300 is positioned such that the injecting portions 310c (FIG. 6) of the plurality of nozzles 310 are contained in a plurality of waiting holes 510 (FIG. 10) of the waiting pod 500.

When the nozzle driver 400 starts to operate in the state shown in FIG. 9, the nozzle arm unit 300 is lifted to a height position farther upward than the cylindrical member 200 together with the rotation shaft 401 as indicated by the thick solid arrow in FIG. 10. Thus, the injecting portions 310c (FIG. 6) of the plurality of nozzles 310 are drawn out from the plurality of waiting holes 510 of the waiting pod 500.

Next, the rotation shaft 401 of the nozzle driver 400 rotates by a predetermined angle (90° in the present example). Thus, the nozzle arm unit 300 rotates about the rotation shaft 401 as indicated by the thick solid arrow in FIG. 11. Thus, the nozzle arm unit 300 is held while extending parallel to the first direction D1. At this time, the nozzle arm unit 300 is positioned such that the cover member 330 overlaps with the nozzle opening 110 of the partition plate 100 in a plan view.

Next, the rotation shaft 401 of the nozzle driver 400 is lowered. Thus, the cover member 330 is lowered as indicated by the thick solid arrow in FIG. 12. At this time, the height position of the nozzle arm unit 300 is adjusted such that the cover member 330 does not come into contact with the partition plate 100 and is sufficiently close to the partition plate 100. This reduces a flow of gas in the nozzle opening 110. In this manner, with the nozzle opening 110 of the partition plate 100 covered by the cover member 330, the plurality of nozzles 310 are held at the processing position P2.

Portions of the plurality of pipes 311, 312 extending outwardly from the nozzle arm unit 300 are movable elements that can be deformed such as stretched, bent, twisted, etc. in correspondence with the movement or rotation of the nozzle arm unit 300. The movable elements of the plurality of pipes 311, 312 are covered by the protection pipe 391. As shown in FIGS. 9 to 12, a fixing portion 392 for fixing part of the protection pipe 391 to part (the unit base body, for example) of the casing CA is provided in the casing CA of FIG. 1.

With the above-mentioned configuration, the plurality of pipes 311, 312 located between the nozzle arm unit 300 and the fixing portion 392 are deformably bound by the protection pipe 391. Therefore, handleability of the plurality of pipes 311, 312 in the casing CA of FIG. 1 is improved. Further, because the protection pipe 391 is flexible, a degree of freedom in regard to each of movement and rotation of the nozzle arm unit 300 is not limited by the protection pipe 391. The plurality of pipes 311, 312 bound by the protection pipe 391 are drawn out from the protection pipe 391 in the vicinity of the fixing portion 392 and connected to the fluid supply path 12 of the fluid supplier 11 of FIG. 1.

(7) Unit Base Body

Figure 13:
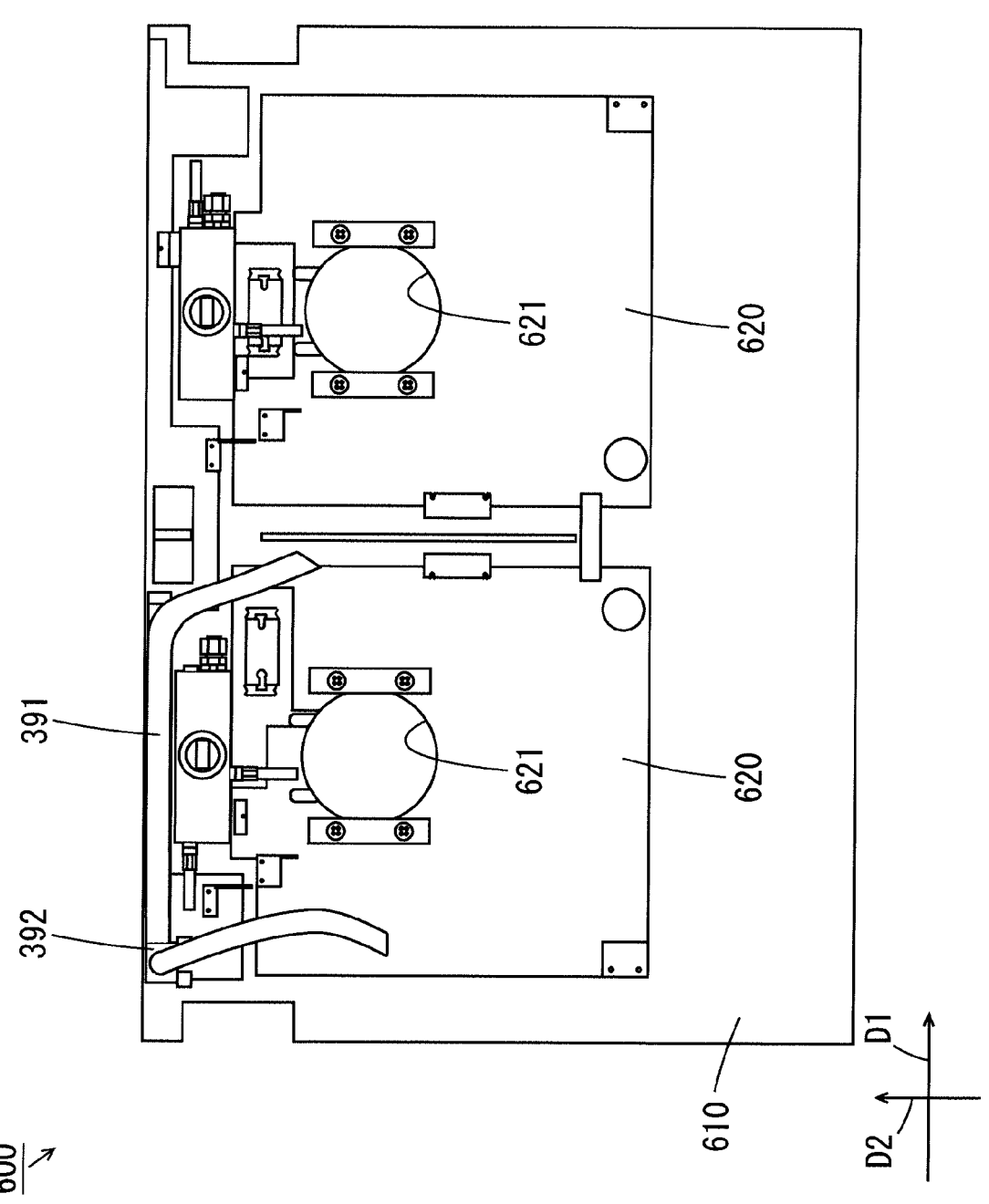
FIG. 13 is a plan view of the unit base body.

FIG. 13 is a plan view of the unit base body. FIG. 14 is a diagram showing the liquid processing units LPA, LPB supported by the unit base body 600 of FIG. 13. As shown in FIG. 13, the unit base body 600 includes a base plate 610 having a substantially rectangular shape. Two unit arrangement regions 620 are provided in a substantially center portion of the base plate 610 so as to be aligned in the first direction D1.

As shown in FIG. 14, the liquid processing units LPA, LPB are respectively arranged in the two unit arrangement regions 620. In this state, a cup 40, a container 50, a substrate holding device 70, a nozzle driver 400 (FIG. 2) and a waiting pod 500 (FIG. 2) in each of the liquid processing units LPA, LPB are supported by the base plate 610.

As described above, in each of the liquid processing units LPA, LPB, the lower portion of the spin motor 72 projects farther downwardly than the bottom portion 52 of the container 50 (FIG. 4). Therefore, as shown in FIG. 13, a circular opening 621 is formed in each unit arrangement region 620. When each of the liquid processing units LPA, LPB is arranged in a corresponding unit arrangement region 620, the lower portion of the spin motor 72 is contained in the opening 621. Thus, the spin motor 72 and the base plate 610 are prevented from interfering with each other.

The fixing portion 392 corresponding to the liquid processing unit LPA is provided in the vicinity of one corner of the base plate 610. The fixing portion 392 corresponding to the liquid processing unit LPB is provided in the vicinity of the other corner of the base plate 610. In FIGS. 13 and 14, only the fixing portion 392 corresponding to the liquid processing unit LPB is shown, and the fixing portion 392 corresponding to the liquid processing unit LPA is not shown. This also applies to FIG. 15, described below.

The protection pipe 391 is fixed onto the unit base body 600 by the fixing portion 392, and the plurality of pipes 311, 312 (FIG. 5) are bundled by the protection pipe 391. Downstream portions of the plurality of pipes 311,312 bundled by the protection pipe 391 are connected to the plurality of nozzles 310 (FIG. 5). Upstream portions of the plurality of pipes 311, 312 are drawn out from the protection pipe 391 and connected to the fluid supply path 12 (FIG. 1) of the fluid supplier 11 (FIG. 1).

Further, the unit base body 600 is provided with exhaust ducts 20 respectively corresponding to the liquid processing units LPA, LPB. An exhaust gas coming from the exhaust pipe 61 (FIG. 4) of each of the liquid processing units LPA, LPB is guided to the exhaust device (not shown) through the corresponding exhaust duct 20. Further, a liquid drain pipe path portion (not shown) respectively corresponding to the liquid processing units LPA, LPB are provided in the unit base body 600. A liquid drained from the drain pipe 62 (FIG. 4) of each of the liquid processing units LPA, LPB is guided to the drain device (not shown) through the corresponding drain pipe path portion.

(8) Exhaust Duct

As described above, the two exhaust ducts 20 are provided to respectively correspond to the liquid processing units LPA, LPB. The two exhaust ducts 20 have basically the same configuration except that they are provided so as to be symmetrical to each other with respect to a plane (vertical plane) orthogonal to the first direction D1. The configuration of the exhaust duct 20 corresponding to the liquid processing unit LPB will be described as a representative of the two exhaust ducts 20.

FIG. 15 is a diagram showing the exhaust duct 20 supported by the unit base body 600 of FIG. 13. In FIG. 15, only part of the constituent elements of the liquid processing units LPA, LPB is shown. Further, in FIG. 15, the outer edges of the cup 40 and the container 50 of the liquid processing unit LPB are indicated by the dotted lines. As shown in FIG. 15, the exhaust duct 20 includes exhaust pipe path portions 21 to 24, and forms an exhaust flow path for exhausting gas in the cup 40.

The exhaust pipe path portion 21 extends in the first direction D1 and is provided at a position spaced apart from the center portion of the liquid processing unit LPB in the second direction D2. The exhaust pipe path portion 22 and the exhaust pipe path portion 23 extend in the second direction D2 and are provided so as to be opposite to each other with the center portion of the liquid processing unit LPB interposed therebetween. The downstream end portion of the exhaust pipe path portion 22 is connected to the upstream end portion of the exhaust pipe path portion 21. The downstream end portion of the exhaust pipe path portion 22 is connected to a portion between the upstream end portion and the downstream end portion of the exhaust pipe path portion 21. Oblong openings 22a, 23a are respectively formed in the upper surfaces of the upstream end portions of the exhaust pipe path portions 22, 23. The lower end portions of the two exhaust pipes 61 (FIG. 4) are respectively inserted into the openings 22a, 23a.

The exhaust pipe path portion 24 extends in the second direction D2 and is provided in the vicinity of an end portion of the unit base body 600 in the first direction D1. The upstream end portion of the exhaust pipe path portion 24 is connected to the downstream end portion of the exhaust pipe path portion 21. Thus, the connection portion between the downstream end portion of the exhaust pipe path portion 21 and the upstream end portion of the exhaust pipe path portion 24 is a bent portion 25 which is bent by a predetermined angle (90° in the present example). The downstream end portion of the exhaust pipe path portion 24 is connected to the exhaust device (not shown).

With the above-mentioned connection, gas exhausted from the two exhaust pipes 61 is introduced into the exhaust pipe path portions 22, 23 through the openings 22a, 23a. An exhaust gas introduced into the exhaust pipe path portions 22, 23 flows from an upstream portion to a downstream portion through the exhaust pipe path portions 21, 24 as indicated by the thick one-dot and dash line in FIG. 15. Thus, an exhaust gas is guided to the exhaust device.

Here, a large portion of the exhaust pipe path portions 21 to 24 are located below the cup 40 and the container 50 of the liquid processing unit LPB. That is, a large portion of the exhaust pipe path portions 21 to 24 overlap with the cup 40 and the container 50 of the liquid processing unit LPB in a plan view. Therefore, a footprint of the development device 1 (FIG. 1) can be reduced. On the other hand, the bent portion 25 of the exhaust duct 20 does not overlap with the cup 40 or the container 50 of the liquid processing unit LPB in a plan view.

FIG. 16 is a partially enlarged perspective view showing the configuration around the bent portion 25 of the exhaust duct 20 of FIG. 15. As shown in FIG. 16, an opening 25a is formed in the upper surface of the bent portion 25. In the bent portion 25, a mist collecting member 30 is arranged at a position overlapping with the opening 25a.

The mist collecting member 30 is a plate that collects a mist component of a processing liquid and allows a gas component to pass therethrough, and has a substantially rectangular shape in the present example. The mist collecting member 30 may be a punching plate, a mesh or a filter. The mist collecting member 30 is arranged in a vertical attitude. Here, in a plan view, one end portion of the mist collecting member 30 is fixed to a portion in the vicinity of an inner corner portion of the bent portion 25, and the other end portion of the mist collecting member 30 is fixed in the vicinity of an outer corner portion of the bent portion 25.

A lid portion 26 is attached to the bent portion 25 so as to close the opening 25a. When the opening 25a is closed by the lid portion 26, an exhaust gas is prevented from leaking from the opening 25a. Therefore, the lid portion 26 forms part of the exhaust flow path. That is, the lid portion 26 is attached to the exhaust duct 20, so that the exhaust flow path is formed.

At least part of the lid portion 26 is preferably formed of a light-transmitting member. In the present example, the lid portion 26 includes a light transmitting portion 26a and a frame 26b. The light transmitting portion 26a is formed of a light transmitting member such as glass or a transparent resin and is attached to the frame 26b. The frame 26b is formed of a metallic member, for example, and is fixed to the bent portion 25 by a plurality of fixing members 27. Thus, the opening 25a is closed.

The mist collecting member 30 is arranged in the bent portion 25, so that a mist component of a processing liquid flowing through the exhaust duct 20 is collected. In this case, a gas component of the processing liquid is mainly guided downstream of the exhaust duct 20. Thus, the downstream portion of the exhaust duct 20 is prevented from being contaminated by a mist component of the processing liquid. In particular, in the bent portion 25, particles included in an exhaust gas collide with the inner wall of the exhaust duct 20, so that a mist component of the processing liquid is likely to become apparent. Therefore, a mist component of the processing liquid flowing through the exhaust duct 20 can be efficiently collected.

In a case in which the mist collecting member 30 is used for a long period of time, maintenance such as replacement or cleaning of the mist collecting member 30 is required. Even in this case, because the bent portion 25 does not overlap with the cup 40 or the container 50 of the liquid processing unit LPB in a plan view, the user can easily access the bent portion 25. Therefore, the user can easily maintain the mist collecting member 30 by detaching the lid portion 26. In the present example, because the lid portion 26 is attached to the upper surface of the bent portion 25, the user can perform the maintenance work from above. Therefore, the working efficiency is further improved.

Because the light transmitting portion 26a of the lid portion 26 is formed of a light transmitting member, the user can visually check a degree of contamination of the mist collecting member 30 through the light transmitting portion 26a without detaching the lid portion 26. Thus, the user can easily determine the time for maintenance of the mist collecting member 30. Further, in the present example, the fixing member 27 is a screw, and the outer peripheral surface of the head of the screw is knurled. Therefore, the user can easily attach the lid portion 26 to or detach the lid portion 26 from the bent portion 25 by operating the fixing member 27 without using a tool.

(9) Operation of Cup

In the development device 1, the cup 40 is kept in the first state when the substrate W is carried into or carried out from the liquid processing unit LPA, LPB. On the other hand, during the development processing for the substrate W held by the substrate holding device 70, the cup 40 is kept in the second state. The first state and the second state of the cup 40 will be described.

FIG. 17 is a schematic longitudinal cross sectional view of the development device 1 when the cup 40 of the liquid processing unit LPA, LPB is in the first state. FIG. 18 is a schematic longitudinal cross sectional view of the development device 1 when the cup 40 of the liquid processing unit LPA, LPB is in the second state. In FIGS. 17 and 18, each nozzle arm unit 300 located at the waiting position P1 is indicated by the dotted lines. Further, in FIGS. 17 and 18, part of the plurality of constituent elements of the liquid processing units LPA, LPB is not shown.

As shown in FIG. 17, when being in the first state, each cup 40 is located in each container 50. That is, when being in the first state, the cup 40 overlaps with the container 50 in a side view and are spaced apart from the cylindrical member 200. Therefore, when the cup 40 is in the first state, the substrate holding device 70 can be accessed from the side of the cup 40 and the container 50. Thus, the substrate W carried in from the outside of the development device 1 can be placed on the suction holder 71 of the liquid processing unit LPA, LPB. Further, the substrate W placed on the suction holder 71 of the liquid processing unit LPA, LPB can be taken out to be carried out from the development device 1.

The height (dimension in the vertical direction) of the cup 40 is set larger than the distance between the cylindrical member 200 and the container 50 in the vertical direction. As shown in FIG. 18, when being in the second state, the cup 40 overlaps with the lower end of the cylindrical member 200 and the upper end of the container 50 in a side view. At this time, the upper end of the cup 40 and the inner peripheral surface in the vicinity of the lower end of the cylindrical member 200 are close to each other. Further, the lower end of the cup 40 and the inner peripheral surface in the vicinity of the upper end of the container 50 are close to each other.

(10) Processing Space and Non-processing Space

Figure 19:
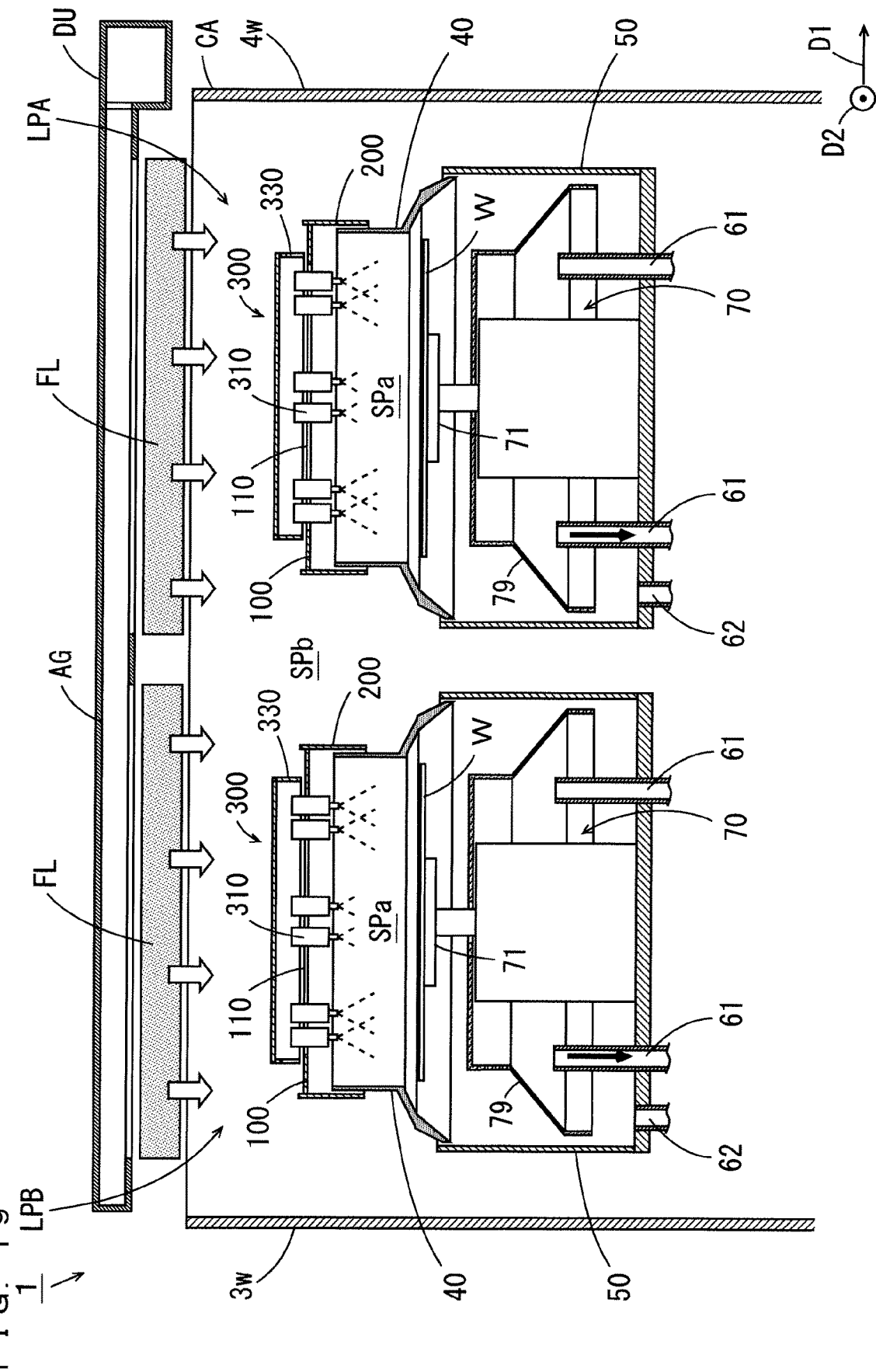
FIG. 19 is a schematic longitudinal cross sectional view of the development device during development processing for substrates.

During the development processing for the substrate W, the cup 40 is held in the second state, and the plurality of nozzles 310 of the nozzle arm unit 300 are arranged at the processing position P2. FIG. 19 is a schematic longitudinal cross sectional view of the development device 1 during the development processing for the substrates W. As shown in FIG. 19, during the developing processing for the substrates W, in each of the liquid processing units LPA, LPB, the plurality of nozzles 310 are arranged at the processing position P2 (FIG. 12), and the cover member 330 covers the nozzle opening 110 of the partition plate 100. Thus, the inner space SP of the casing CA is partitioned into the processing spaces SPa and the non-processing space SPb by the partition plates 100, the cylindrical members 200, the cover members 330, the cups 40 and the containers 50 of the liquid processing units LPA, LPB. Each processing space SPa is a space including the substrate W held by each substrate holding device 70, and the non-processing space SPb is a space surrounding the processing spaces SPa.

As indicated by the outlined arrows in FIG. 19, clean air is continuously supplied to the non-processing space SPb from above. Further, part of the clean air supplied to the non-processing space SPb is supplied to the processing spaces SPa through the plurality of through holes H (FIG. 8) of the partition plates 100. Thus, in the casing CA, a downward flow of clean air is formed in each of the two processing spaces SPa and the non-processing space SPb.

The inner peripheral surface of the liquid receiving portion 42 of the cup 40 forming each processing space SPa surrounds the substrate W held by the substrate holding device 70 in a horizontal plane. Thus, large portions of the development liquid and the rinse liquid supplied to the substrate W from the plurality of nozzles 310 during the development processing for the substrate W are received by the inner peripheral surface of the liquid receiving portion 42 and guided to the container 50. On the other hand, splashes of the development liquid or the rinse liquid that are not received by the liquid receiving portion 42 and splash around the substrate W are guided to the container 50 by a downward airflow formed in the processing space SPa.

When the substrate W is rotated by the substrate holding device 70 in the processing space SPa, an airflow (upward airflow) directed from below toward above may be generated along the inner peripheral surfaces of the cup 40 and the cylindrical member 200 in the vicinity of the peripheral edge of the substrate W. In this case, when an atmosphere including splashes of the development liquid or the rinse liquid is lifted in the processing space SPa, these splashes may adhere to the lower surface of the partition plate 100 and the inner peripheral surface of the cylindrical member 200. Further, these splashes may re-adhere to the substrate W.

As such, as described with reference to FIG. 8, in a case in which concentric circles are defined on the substrate W, the partition plate 100 is fabricated such that the number of through holes H formed on the largest virtual circle vc1 is larger than the number of through holes H formed on each of the rest of the virtual circles vc1. Further, the partition plate 100 is fabricated such that the plurality of through holes H are dispersedly arranged at constant intervals over the entire largest virtual circle vc1 surrounding the nozzle opening 110. Alternatively, in a case in which the center region A1 and the outer peripheral region A2 are defined on the partition plate 100, the partition plate 100 is fabricated such that the number of through holes H formed in the outer peripheral region A2 is larger than the number of through holes H formed in the center region A1.

With the above-mentioned configuration of the partition plate 100, in the processing space SPa, an amount of a downward airflow guided to the vicinity of the inner peripheral surface of the cup 40 can be made larger than an amount of a downward airflow guided to the center portion of the substrate W. In particular, in a case in which the plurality of through holes H are dispersedly arranged at constant intervals over the entire largest virtual circle vc1 surrounding the nozzle opening 110, it is possible to form a downward airflow in the vicinity of the inner peripheral surface of the cup 40 over the entire circumference of the inner peripheral surface of the cup 40. This suppresses generation of an upward airflow in the vicinity of the inner peripheral surface of the cup 40 during rotation of the substrate W. Therefore, in the processing space SPa, upward splashing of the development liquid or the rinse liquid supplied to the substrate W in the vicinity of the outer peripheral end of the substrate W is suppressed. As a result, adherence of splashes of the development liquid or the rinse liquid to the lower surface of the partition plate 100 and the inner peripheral surface of the cylindrical member 200 is suppressed. Further, re-adherence of the development liquid or the rinse liquid to the substrate W is suppressed.

3. Configuration of Controller of Development Device

FIG. 20 is a block diagram showing the configuration of the controller 90 of the development device 1 of FIG. 1. As shown in FIG. 20, the controller 90 includes a first lifting-lowering controller 91, a fluid controller 92, a first rotation controller 93, a suction controller 94, a second lifting-lowering controller 95 and a second rotation controller 96. The function of each element of the controller 90 of FIG. 20 is implemented by execution of a predetermined program stored in the memory by the CPU, for example.

The first lifting-lowering controller 91 controls the operations of the lifting-lowering drivers 49 of the liquid processing units LPA, LPB. Thus, the cup 40 of each of the liquid processing units LPA, LPB changes to the first state or the second state. The fluid controller 92 controls the operations of the two fluid suppliers 11 of FIG. 1. Thus, in each of the liquid processing units LPA, LPB, a fluid mixture of a development liquid and gas is injected from part of the plurality of nozzles 310, and a fluid mixture of a rinse liquid and gas is injected from the rest of the nozzles 310.

The first rotation controller 93 controls the operations of the spin motors 72 of the liquid processing units LPA, LPB of FIG. 1. Further, the suction controller 94 controls the operations of the suction devices 78 of the liquid processing units LPA, LPB of FIG. 1. Thus, in each substrate holding device 70, the substrate W is held by suction and rotated in a horizontal attitude.

The second lifting-lowering controller 95 and the second rotation controller 96 control the operations of the nozzle drivers 400 of the liquid processing units LPA, LPB of FIG. 1. Specifically, the second lifting-lowering controller 95 controls the operation of the actuator of each nozzle driver 400. The second rotation controller 96 controls the operation of the motor having the rotation shaft 401 of each nozzle driver 400.

4. Basic Operation of Development Device

Figure 21:
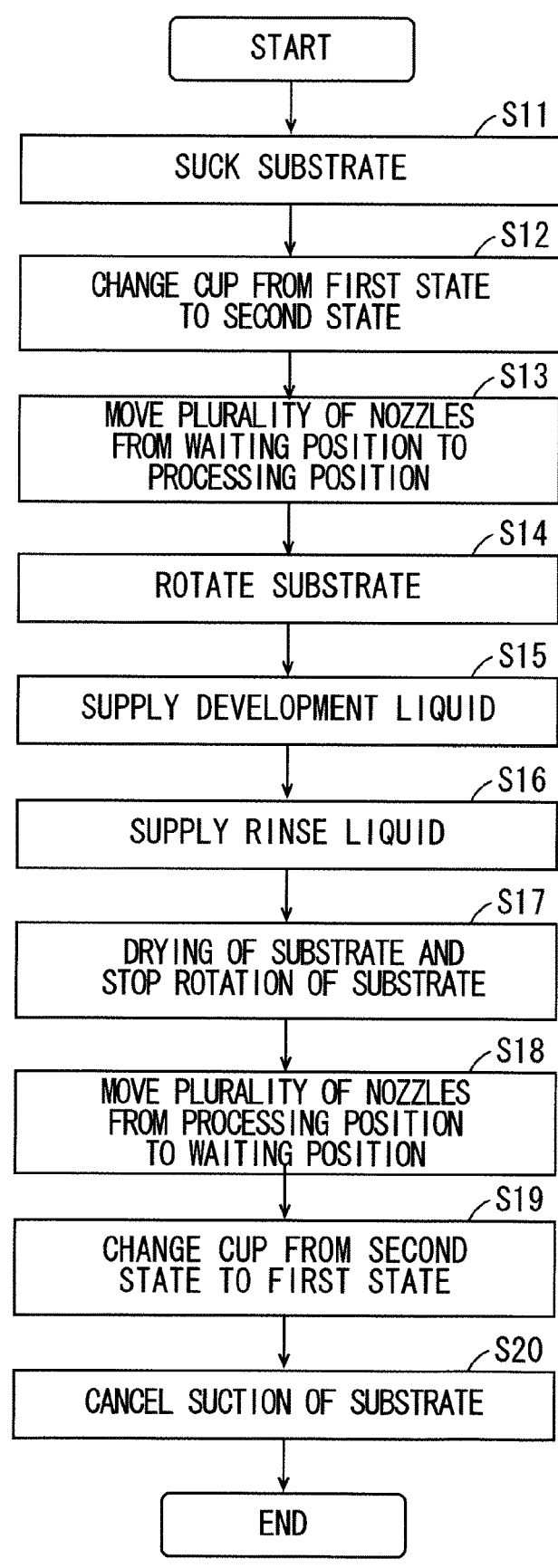
FIG. 21 is a flowchart showing the basic operation during the development processing for a substrate performed by the development device.

The basic operation of the development device 1 will be described. FIG. 21 is a flowchart showing the basic operation during the development processing for the substrate W performed by the development device 1. In an initial state, air the temperature, humidity and the like of which are adjusted is supplied from the gas supplier 10 to the development device 1. Further, an atmosphere in the casing CA is guided to the exhaust device (not shown) from the exhaust pipes 61 of the liquid processing units LPA, LPB through the exhaust duct 20. A downward flow of clean air is formed in the casing CA. Further, in the initial state, the cup 40 is held in the first state. Further, the plurality of nozzles 310 are held at the waiting position P1.

Before the development processing for the substrate W is started, the substrate W to be processed is first carried into the liquid processing unit LPA, LPB. Further, as shown in FIG. 17, the substrate W is placed on the suction holder 71 of the substrate holding device 70. When the development processing for the substrate W is started, the suction controller 94 of FIG. 20 controls the suction device 78 of the liquid processing unit LPA, LPB such that the substrate W is sucked by the suction holder 71 of the substrate holding device 70 (step S11).

Next, the first lifting-lowering controller 91 of FIG. 20 controls the lifting-lowering driver 49 of the liquid processing unit LPA, LPB such that cup 40 changes from the first state to the second state (step S12).

Next, the second lifting-lowering controller 95 and the second rotation controller 96 of FIG. 20 control the nozzle driver 400 of the liquid processing unit LPA, LPB such that the plurality of nozzles 310 move from the waiting position P1 to the processing position P2 (step S13).

Next, the first rotation controller 93 of FIG. 20 controls the spin motor 72 of the liquid processing unit LPA, LPB such that the substrate W rotates about the rotation shaft 73 (step S14).

Next, the fluid controller 92 of FIG. 20 controls the fluid supplier 11 of the liquid processing unit LPA, LPB such that a development liquid is supplied to the substrate W from part of the plurality of nozzles 310 for a predetermined period of time (step S15). Further, the fluid controller 92 of FIG. 20 controls the fluid supplier 11 of the liquid processing unit LPA, LPB such that a rinse liquid is supplied to the substrate W from the rest of the plurality of nozzles 310 for a predetermined period of time (step S16).

Next, the first rotation controller 93 of FIG. 20 dries the substrate W by continuing to rotate the substrate W until a constant period of time elapses from the time when supply of the rinse liquid is stopped. Further, the first rotation controller 93 of FIG. 20 controls the spin motor 72 of the liquid processing unit LPA, LPB such that the rotation of the substrate W is stopped after the constant period of time elapses from the time when supply of the rinse liquid is stopped (step S17).

Next, the second lifting-lowering controller 95 and the second rotation controller 96 of FIG. 20 control the nozzle driver 400 of the liquid processing unit LPA, LPB such that the plurality of nozzles 310 move from the processing position P2 to the waiting position P1 (step S18).

Next, the first lifting-lowering controller 91 of FIG. 20 controls the lifting-lowering driver 49 of the liquid processing unit LPA, LPB such that cup 40 changes from the second state to the first state (step S19).

Finally, the suction controller 94 of FIG. 20 controls the suction device 78 of the liquid processing unit LPA, LPB such that suction of the substrate W by the suction holder 71 of the substrate holding device 70 is released (step S20). Thus, the development processing for the substrate W ends. The substrate W on which the development processing has been performed is carried out from the liquid processing unit LPA, LPB.

5. Effects

In the development device 1 according to the present embodiment, the gas in cup 40 is exhausted through the exhaust flow path formed of the exhaust duct 20. Here, even in a case in which a processing liquid used for the substrate processing is atomized in the exhaust duct 20, a mist component is collected by the mist collecting member 30. Therefore, the inside of the exhaust duct 20 is prevented from being contaminated.

Further, the opening 25a of the exhaust duct 20 is formed in a portion of the exhaust duct 20 that does not overlap with the cup 40 or the container 50 in a plan view. Further, the mist collecting member 30 is provided at a position overlapping with the opening 25a in the exhaust duct 20. In this case, it is not necessary to detach the cup 40 and the container 50 when detaching the lid portion 26 that closes the opening 25a. Thus, the user can easily detach the lid portion 26 and maintain the mist collecting member 30. As a result, maintenance work for the development device 1 can be efficiently performed.

Specifically, the opening 25a is formed in the bent portion 25 that does not overlap with the cup 40 or the container 50 in a plan view. Further, the mist collecting member 30 is provided in the bent portion 25. In this case, it is possible to form the opening 25a in a portion of the exhaust duct 20 that does not overlap with the cup 40 or the container 50 in a plan view while preventing an increase in footprint. Further, in the bent portion 25, particles included in an exhaust gas collide with the inner wall of the exhaust duct 20, so that a mist component of a processing liquid is likely to become apparent. Therefore, the mist component of the processing liquid flowing through the exhaust duct 20 can be efficiently collected by the mist collecting member 30.

The opening 25a is formed in the upper surface of the exhaust duct 20. In this case, the user can perform maintenance work from above. Therefore, the working efficiency is further improved.

The lid portion 26 includes the light transmitting portion 26a and the frame 26b. In this case, the user can visually check the degree of contamination of the mist collecting member 30 through the light transmitting portion 26a of the lid portion 26 without detaching the lid portion 26. Thus, the user can easily determine the time for maintenance of the mist collecting member 30. Further, it is possible to easily attach the lid portion 26 to the exhaust duct 20 by fixing the frame 26b of the lid portion 26 to the exhaust duct 20 using the fixing member 27.

6. Other Embodiments (1) While the opening 25a is formed in the bent portion 25 in the above-mentioned embodiment, the embodiment is not limited to this. The opening 25a may be formed in any portion of the exhaust duct 20 that does not overlap with the cup 40 or the container 50 in a plan view. In this case, the exhaust duct 20 does not have to have the bent portion 25.

(2) While the opening 25a is formed in the upper surface of the exhaust duct 20 in the above-mentioned embodiment, the embodiment is not limited to this. The opening 25a may be formed in the side surface or the like of the exhaust duct 20.

(3) While part of the lid portion 26 is formed of a light-transmitting member in the above-mentioned embodiment, the embodiment is not limited to this. The entire lid portion 26 may be formed of a light-transmitting member. On the other hand, in the exhaust duct 20, it is possible to check the degree of contamination of the mist collecting member 30 by measuring the pressure in a portion located farther downstream than the mist collecting member 30. Therefore, in a case in which it is not necessary to visually check the degree of contamination of the mist collecting member 30, the entire lid portion 26 may be formed of a non-light transmitting member.

(4) While the development device 1 includes the unit base body 600 in the above-mentioned embodiment, the embodiment is not limited to this. In a case in which the cup 40 and the container 50 are supported by a different base from a base that supports the exhaust duct 20, the development device 1 does not have to include the unit base body 600.

(5) While each of the liquid processing units LPA, LPB includes the container 50 surrounding the cup 40 in the above-mentioned embodiment, the embodiment is not limited to this. Each of the liquid processing units LPA, LPB does not have to include the container 50. In this configuration, in a plan view, the opening 25a of the exhaust duct 20 may be formed in a portion that does not overlap with the cup 40 in the exhaust duct 20.

7. Correspondences Between Constituent Elements in Claims and Parts in Preferred Embodiments In the following paragraphs, non-limiting examples of correspondences between various elements recited in the claims below and those described above with respect to various preferred embodiments of the present disclosure are explained.

In the above-mentioned embodiment, the cup 40 is an example of a cup, the opening 25a is an example of an opening, the exhaust duct 20 is an example of an exhaust duct, the mist collecting member 30 is an example of a mist collecting member, and the lid portion 26 is an example of a lid portion. The development device 1 is an example of a substrate processing apparatus, the bent portion 25 is an example of a bent portion, the light transmitting portion 26a is an example of a light transmitting portion, the frame 26b is an example of a frame, the unit base body 600 is an example of a base portion, and the container 50 is an example of a surrounding member.

8. Overview of Embodiments (Item 1) A substrate processing apparatus according to item 1 includes a cup surrounding a substrate that is being processed with use of a processing liquid, an exhaust duct that has an opening in a portion not overlapping with the cup in a plan view and forms an exhaust flow path for exhausting a gas in the cup, a mist collecting member that is provided at a position overlapping with the opening and collects a mist component of the processing liquid in the exhaust duct, and a lid portion that closes the opening of the exhaust duct.

In this substrate processing apparatus, gas in the cup is exhausted through the exhaust flow path formed of the exhaust duct. Here, even in a case in which a processing liquid used for the substrate processing is atomized in the exhaust duct, a mist component is collected by the mist collecting member. Therefore, the inside of the exhaust duct is prevented from being contaminated.

Further, the opening of the exhaust duct is formed in a portion of the exhaust duct that does not overlap with the cup in a plan view. Further, the mist collecting member is provided at a position overlapping with the opening in the exhaust duct. In this case, it is not necessary to detach the cup when detaching the lid portion that closes the opening. Thus, the user can easily detach the lid portion to maintain the mist collecting member. As a result, maintenance work for the substrate processing apparatus can be efficiently performed.

(Item 2) The substrate processing apparatus according to item 1, wherein the exhaust duct may have a bent portion not overlapping with the cup in the plan view, the opening may be formed in the bent portion, and the mist collecting member may be provided in the bent portion.

In this case, it is possible to form an opening in a portion of the exhaust duct that does not overlap with the cup in a plan view while preventing an increase in footprint. Further, in the bent portion, particles included in gas collide with the inner wall of the exhaust duct, so that a mist component of the processing liquid is likely to become apparent. Therefore, the mist component of the processing liquid flowing through the exhaust duct can be efficiently collected by the mist collecting member.

(Item 3) The substrate processing apparatus according to item 1 or 2, wherein the opening may be formed in an upper surface of the exhaust duct.

In this case, because the lid portion is attached to the upper surface of the exhaust duct, the user can perform maintenance work from above. Therefore, the working efficiency is further improved.

(Item 4) The substrate processing apparatus according to any one of items 1 to 3, wherein at least part of the lid portion may be formed of a light transmitting member.

In this case, the user can visually check a degree of contamination of the mist collecting member through a portion formed of the light-transmitting member of the lid portion without detaching the lid portion. Thus, the user can easily determine the time for maintenance of the mist collecting member.

(Item 5) The substrate processing apparatus according to item 4, wherein the lid portion may include a light transmitting portion formed of the light transmitting member, and a frame to which the light transmitting portion is attached.

In this case, it is possible to easily attach the lid portion to the exhaust duct while facilitating visual observation of the collecting member.

(Item 6) The substrate processing apparatus according to any one of items 1 to 5, wherein the lid portion may form part of the exhaust flow path.

In this case, it is possible to form the exhaust flow path by attaching the lid portion to the exhaust duct.

(Item 7) The substrate processing apparatus according to any one of items 1 to 6, may further include a base portion that supports the cup and the exhaust duct.

In this case, the cup and the exhaust duct can be easily supported.

(Item 8) The substrate processing apparatus according to any one of items 1 to 7, may further include a surrounding member that surrounds the cup, wherein the opening may be formed in a portion of the exhaust duct not overlapping with the surrounding member in the plan view.

With this configuration, even in a case in which the surrounding member is provided around the cup, it is not necessary to detach the surrounding member when detaching the lid portion that closes the opening. Therefore, maintenance work for the substrate processing apparatus can be efficiently performed.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

I claim:

1. A substrate processing apparatus comprising:
a cup surrounding a substrate that is being processed with use of a processing liquid,
an exhaust duct that has an opening in a portion not overlapping with the cup in a plan view and forms an exhaust flow path for exhausting a gas in the cup;
a mist collecting member that is provided at a position overlapping with the opening and collects a mist component of the processing liquid in the exhaust duct; and
a lid portion that closes the opening of the exhaust duct, wherein at least part of the lid portion is formed of a light transmitting member.

2. The substrate processing apparatus according to claim 1, wherein
the exhaust duct has a bent portion not overlapping with the cup in the plan view,
the opening is formed in the bent portion, and
the mist collecting member is provided in the bent portion.

3. The substrate processing apparatus according to claim 1, wherein
the opening is formed in an upper surface of the exhaust duct.

4. The substrate processing apparatus according to claim 1, wherein
the lid portion includes a light transmitting portion formed of the light transmitting member, and
a frame to which the light transmitting portion is attached.

5. The substrate processing apparatus according to claim 1, wherein
the lid portion forms part of the exhaust flow path.

6. The substrate processing apparatus according to claim 1, further comprising a base portion that supports the cup and the exhaust duct.

7. A substrate processing apparatus comprising:
a cup surrounding a substrate that is being processed with use of a processing liquid;
an exhaust duct that has an opening in a portion not overlapping with the cup in a plan view and forms an exhaust flow path for exhausting a gas in the cup;
a mist collecting member that is provided at a position overlapping with the opening and collects a mist component of the processing liquid in the exhaust duct;
a lid portion that closes the opening of the exhaust duct; and
a surrounding member that surrounds the cup, wherein
the opening is formed in a portion of the exhaust duct not overlapping with the surrounding member in the plan view.

8. The substrate processing apparatus according to claim 7, wherein
the exhaust duct has a bent portion not overlapping with the cup in the plan view,
the opening is formed in the bent portion, and
the mist collecting member is provided in the bent portion.

9. The substrate processing apparatus according to claim 7, wherein
the opening is formed in an upper surface of the exhaust duct.

10. The substrate processing apparatus according to claim 7, wherein
the lid portion forms part of the exhaust flow path.

11. The substrate processing apparatus according to claim 7, further comprising a
base portion that supports the cup and the exhaust duct.

* * * * *